United States Patent
Cai et al.

(10) Patent No.: US 12,520,566 B2
(45) Date of Patent: Jan. 6, 2026

(54) CONTACT STRUCTURE AND MANUFACTURING METHOD THEREOF

(71) Applicant: Taiwan Semiconductor Manufacturing Company, Ltd., Hsin-Chu (TW)

(72) Inventors: Chung-Hao Cai, Hsinchu (TW); Chia-Hsien Yao, Hsinchu (TW); Yen-Jun Huang, Hsinchu (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 393 days.

(21) Appl. No.: 18/333,682

(22) Filed: Jun. 13, 2023

(65) Prior Publication Data

US 2024/0038593 A1    Feb. 1, 2024

Related U.S. Application Data

(60) Provisional application No. 63/393,128, filed on Jul. 28, 2022.

(51) Int. Cl.
*H10D 84/03* (2025.01)
*H10D 84/01* (2025.01)
*H10D 84/83* (2025.01)

(52) U.S. Cl.
CPC .......... *H10D 84/038* (2025.01); *H10D 84/013* (2025.01); *H10D 84/0149* (2025.01); *H10D 84/0151* (2025.01); *H10D 84/0158* (2025.01); *H10D 84/834* (2025.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |

(Continued)

FOREIGN PATENT DOCUMENTS

TW    201923908 A    6/2019

*Primary Examiner* — Khaja Ahmad
(74) *Attorney, Agent, or Firm* — HAYNES AND BOONE, LLP

(57) ABSTRACT

A method includes forming first and second fins disposed on a substrate, forming a gate structure over the first and second fins, epitaxially growing a first source/drain (S/D) feature on the first fin and a second S/D feature on the second fin, depositing a dielectric layer covering the first and second S/D features, etching the dielectric layer to form a trench exposing the first and second S/D features, forming a metal structure in the trench and extending from the first S/D feature to the second S/D feature, performing a cut metal process to form an opening dividing the metal structure into a first segment over the first S/D feature and a second segment over the second S/D feature, and depositing an isolation feature in the opening. The isolation feature separates the first segment from the second segment.

17 Claims, 25 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2019/0318922 A1* | 10/2019 | Wen .................. H01L 21/32155 |
| 2019/0341387 A1* | 11/2019 | Wang .................... H01L 23/535 |
| 2020/0135574 A1* | 4/2020 | Yang ................... H10D 62/115 |

* cited by examiner

CONTACT STRUCTURE AND MANUFACTURING METHOD THEREOF

PRIORITY

This application claims priority to U.S. Provisional Patent Application Ser. No. 63/393,128 filed on Jul. 28, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in multi-gate device fabrication processes, it is typical to epitaxially grow some semiconductor materials over semiconductor fins as source/drain features. Many technical efforts have been directed to the engineering of the size, shape, and material of these source/drain features. But, issues remain. One issue is related to formation of source/drain contacts. In integrated circuits, source/drain contacts are used for connecting the source/drain features to other portions of the circuits. The formation of source/drain contacts generally includes forming contact openings by etching dielectric layers covering the source/drain features to expose source/drain features in respective contact openings, and depositing metal material(s) into contact openings to form source/drain contacts. With the ever-decreasing spacing between device features, it has become difficult to prevent two contact openings above adjacent source/drain features from merging into one larger contact opening through etching processes. Consequently, a source/drain contact formed in a merged contact opening extends over multiple source/drain features and shorts these adjacent source/drain features, which may cause circuit malfunction. Therefore, while existing methods of manufacturing multi-gate devices have been satisfactory in many respects, challenges with respect to integrity and performance of resulting devices may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
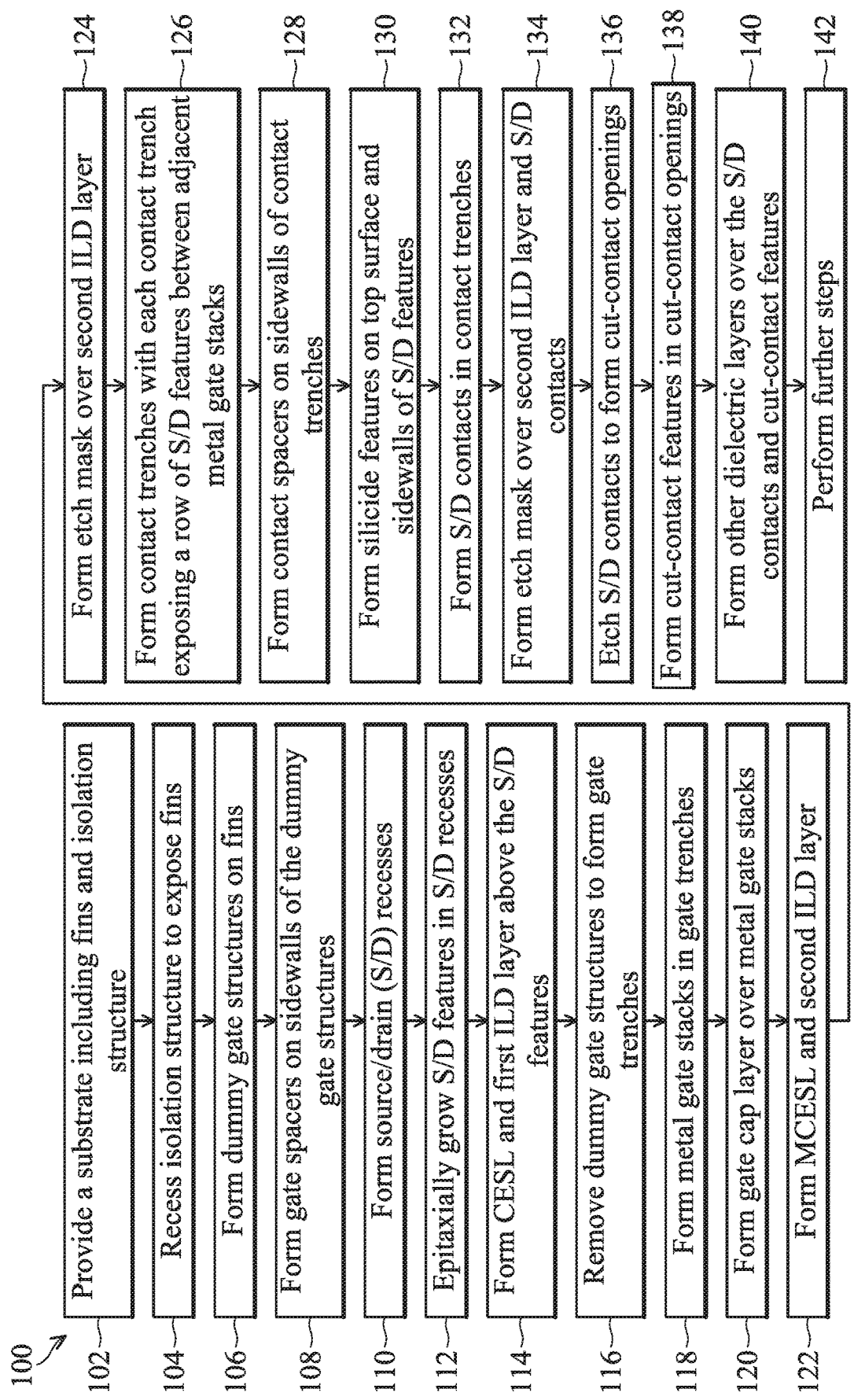
FIG. 1 shows a flow chart of a method for forming a multi-gate device including source/drain contact structures, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to contact structures in semiconductor devices and methods of manufacturing the same. More particularly, the present disclosure is related to formation of source/drain (S/D) contacts over S/D features (or referred to as epitaxial S/D features). As used herein, a source/drain feature, or "S/D feature," may refer to a source or a drain of a device. It may also refer to a region that provides a source and/or drain for multiple devices. An object of the present disclosure is to prevent adjacent S/D contacts from merging and causing circuit shorts of underneath S/D features.

Recently, multi-gate devices have been introduced in an effort to improve gate control by increasing gate-channel coupling, reduce OFF-state current, and reduce short-channel effects (SCEs). A multi-gate device generally refers to a device having a gate structure, or portion thereof, disposed over more than one side of a channel region. One such multi-gate transistor that has been introduced is the fin field-effect transistor (FinFET). The FinFET gets its name from the fin-like structure which extends from a substrate on which it is formed, and which is used to form the FET channel. A further type of multi-gate transistor, introduced in part to address performance challenges associated with some configurations of FinFETs, is the gate-all-around (GAA) transistor. The GAA device gets its name from the gate structure which extends completely around the channel region, providing access to the channel on four sides. GAA devices are compatible with conventional complementary metal-oxide-semiconductor (CMOS) processes and their structure allows them to be aggressively scaled while maintaining gate control and mitigating SCEs. In GAA devices, channel regions may be in the forms of nanosheet channel(s), nanowire channel(s), bar-shaped channel(s), and/or other suitable channel configurations.

In multi-gate device fabrication processes, it is typical to epitaxially grow some semiconductor materials over semiconductor fins as S/D features. S/D contacts (also referred to as S/D contact plugs) are subsequently formed for electrically connecting the source/drain features to other portions of the integrated circuit. The formation of S/D contacts generally includes forming contact openings by etching through dielectric layers covering the S/D features to expose S/D features in respective contact openings, and subsequently depositing metal material(s) into each of the contact openings to form individual source/drain contacts. However, as the semiconductor industry further progresses into sub-10 nanometer (nm) technology process nodes in pursuit of higher device density, higher performance, and lower costs, spacing between adjacent S/D features has been ever decreased. Such decreased spacing should not be omitted as it may lead to insufficient spacing between contact openings formed thereabove and cause merging of adjacent contact openings during respective etching processes. Enlarging spacing between adjacent S/D features is sometimes not an option as it may have to spare space by shrinking sizes of S/D features and may deteriorate circuit performance.

S/D contacts and the methods of forming the same are provided in accordance with various exemplary embodiments. In some exemplary embodiments, a larger contact opening uniting a group of otherwise individually-formed contact openings is formed to expose a row of S/D features between adjacent gate structures and a continuous S/D contact is formed in the contact opening connecting the row of S/D features. Due to its slot shape, such an S/D contact is also referred to as an S/D contact slot or an S/D contact rail. A cut metal process is subsequently performed to divide the S/D contact rail into segments corresponding to underneath individual S/D features. The intermediate stages of forming the transistors are illustrated in accordance with some embodiments in following figures. Some variations of some embodiments are discussed. Throughout the various views and illustrative embodiments, like reference numbers are used to designate like elements. In the illustrated exemplary manufacturing flow, the formation of FinFETs is used as an example to explain the concept of the present disclosure. Other types of transistors, such as GAA transistors and/or planar transistors, may also adopt the concept of the present disclosure.

Figure 2:
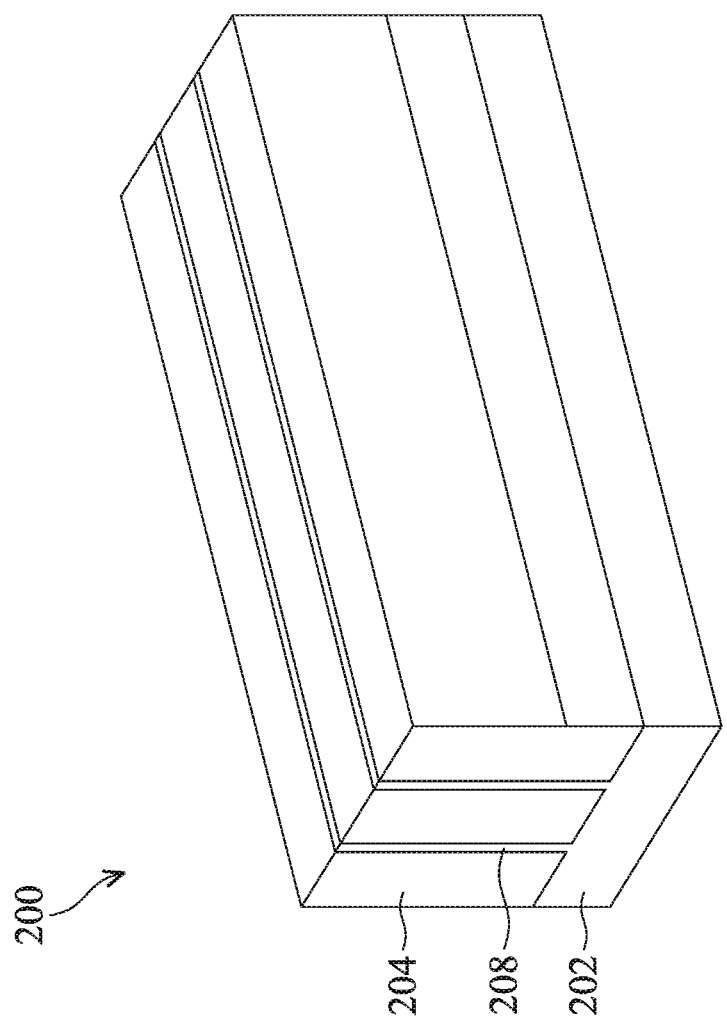
FIGS. 2, 3, and 4 illustrate perspective views of a semiconductor structure during a fabrication process according to the method of FIG. 1, according to aspects of the present disclosure.
Figure 3:
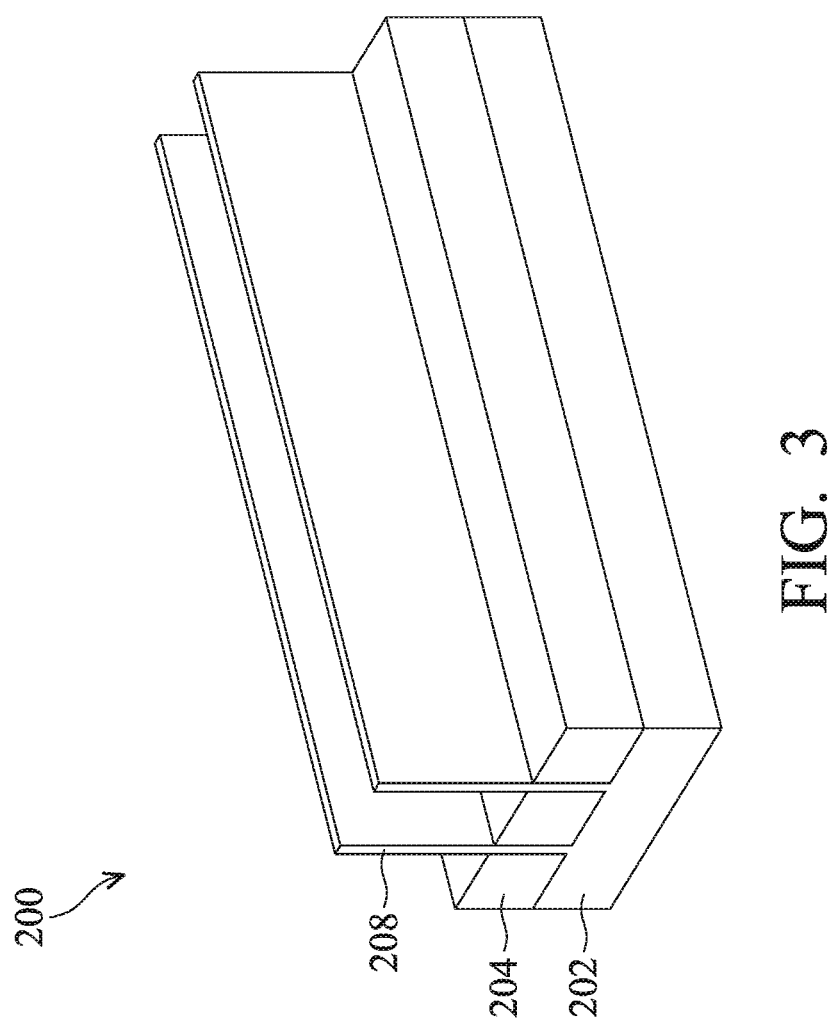
Figure 4:
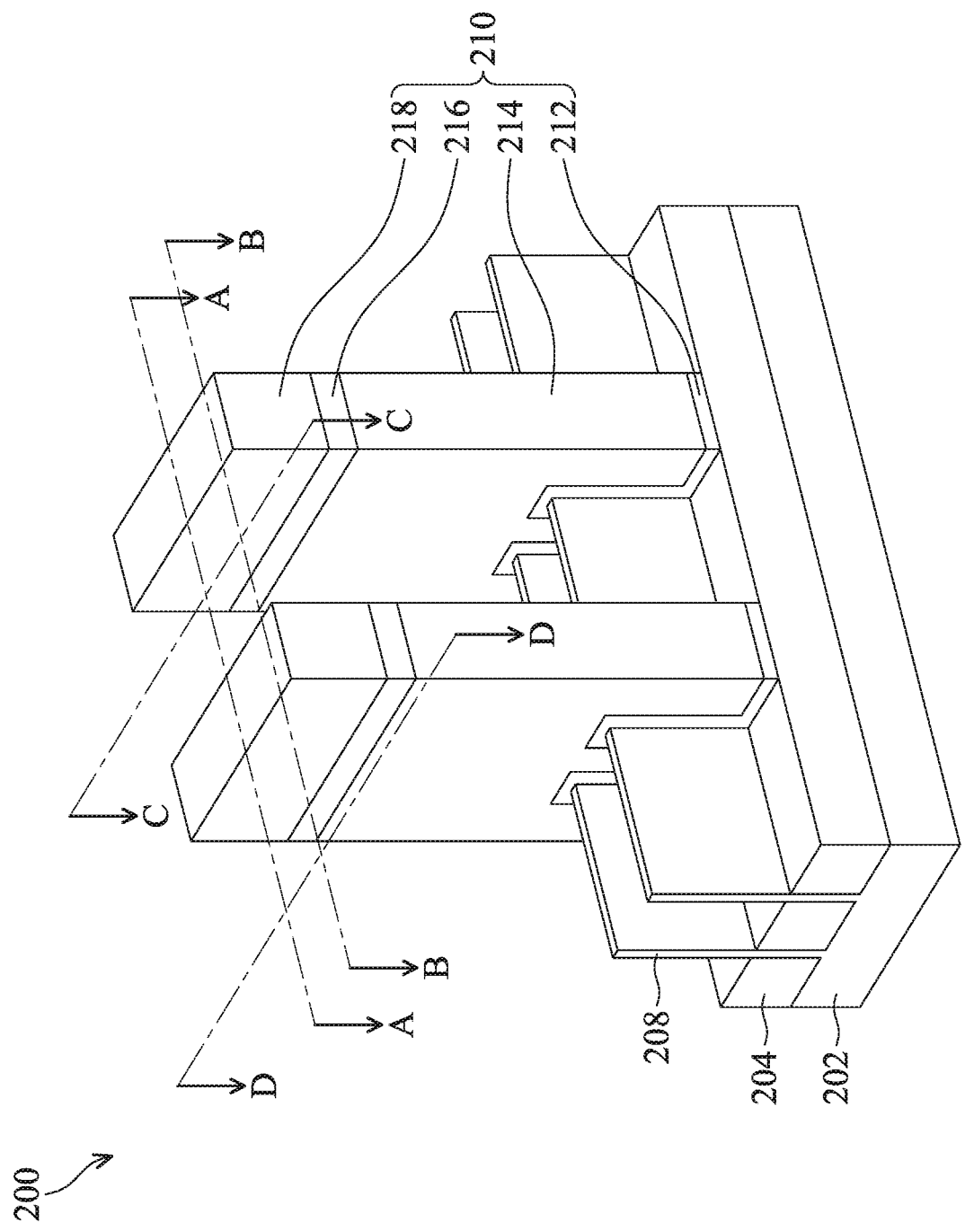

FIG. 1 shows a flow chart of a method 100 for forming a semiconductor device (or structure) 200 in one or more embodiments, according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-25. FIGS. 2, 3, and 4 are perspective views, FIGS. 5, 6, 7, 8, 9, 10, 11, 12, 13, 14, 15, 16, 17, 18, 19, 20, 21, 23, 24 and 25 are cross-sectional views containing cutlines A-A, B-B, C-C, and D-D (as indicated in FIG. 4) respectively, and FIG. 22 is a top view of the structure 200 in intermediate stages of fabrication.

At operation 102, the method 100 (FIG. 1) provides (or is provided with) a structure 200 as shown in FIG. 2. FIG. 2 illustrates a perspective view of the structure 200. The structure 200 includes a substrate 202. The substrate 202 may be a semiconductor substrate (also called wafer in some embodiments), which may be a silicon substrate, a silicon germanium substrate, or a substrate formed of other semiconductor materials. In accordance with some embodiments of the present disclosure, the substrate 202 includes a bulk silicon substrate and an epitaxy silicon germanium (SiGe) layer or a germanium layer (without silicon therein) over the bulk silicon substrate. The substrate 202 may be doped with a p-type or an n-type impurity. Isolation structure 204 such as shallow trench isolation (STI) features may be formed to extend into the substrate 202. The portions of the substrate 202 between neighboring isolation structure 204 are referred to as semiconductor fins (or fins) 208.

The isolation structure 204 may include a liner oxide (not shown). The liner oxide may be formed of a thermal oxide formed through a thermal oxidation of a surface layer of the substrate 202. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structure 204 may also include a dielectric material over the liner oxide, and the dielectric material may be formed using flowable chemical vapor deposition (FCVD), spin-on coating, or the like.

At operation 104, the method 100 (FIG. 1) recesses the isolation structure 204 as shown in FIG. 3. The isolation structure 204 is recessed so that the top portions of the fins 208 protrude higher than the top surfaces of the neighboring isolation structure 204 to form protruding portions of the fins 208. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation structure 204 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of the fins 208 may also be replaced with materials different from that of the substrate 202. For example, if the fins 208 serve for n-type transistors, the fins 208 may be formed of Si, SiP, SiC, SiPC, or a III-V compound semiconductor such as InP, GaAs, AlAs, InAs, InAlAs, InGaAs, or the like. On the other hand, if the fins 208 serve for p-type transistors, the fins 208 may be formed of Si, SiGe, SiGeB, Ge, or a III-V compound semiconductor such as InSb, GaSb, InGaSb, or the like.

Figure 5:
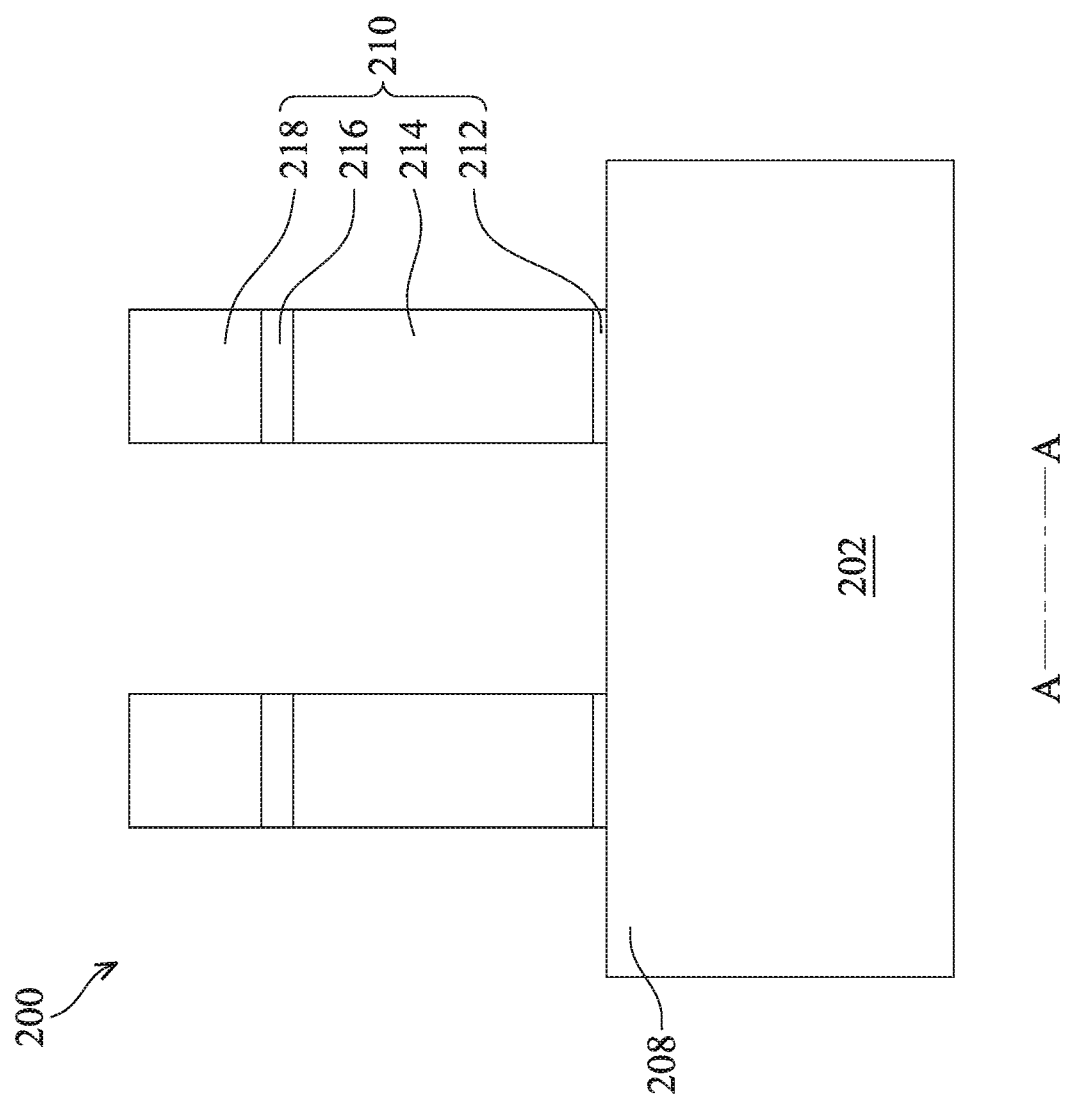
FIGS. 5, 6, 7, 8, 9, 10, 11, 12, 13, 14, 15, 16, 17, 18, 19, 20, 21, 23, 24 and 25 illustrate cross-sectional views of a semiconductor structure during a fabrication process according to the method of FIG. 1, according to aspects of the present disclosure.

At operation 106, the method 100 (FIG. 1) forms dummy gate structures 210 are formed on the top surfaces and the sidewalls of the fins 208 as shown in FIGS. 4 and 5. FIG. 5 illustrates a cross-sectional view obtained from a vertical plane containing line A-A in FIG. 4. Line A-A is along a lengthwise direction of one of the fins 208. Formation of the dummy gate structures 210 includes depositing in sequence a gate dielectric layer and a dummy gate electrode layer across the fins 208, followed by patterning the gate dielectric layer and the dummy gate electrode layer. As a result of the patterning, each of the dummy gate structures 210 includes a dummy gate dielectric layer 212 and a dummy gate electrode 214 over the dummy gate dielectric layer 212. The dummy gate dielectric layers 212 can be any acceptable dielectric layer, such as silicon oxide, silicon nitride, the like, or a combination thereof, and may be formed using any acceptable process, such as thermal oxidation, a spin process, CVD, or the like. The dummy gate electrodes 214 can be any acceptable electrode layer, such as comprising polysilicon, metal, the like, or a combination thereof. The dummy gate electrodes 214 can be deposited by any acceptable deposition process, such as CVD, plasma enhanced CVD (PECVD), or the like. Each of dummy gate structures 210 crosses over a single one or a plurality of fins 208. The dummy gate structures 210 may have lengthwise directions perpendicular to the lengthwise directions of the respective fins 208.

A mask pattern may be formed over the dummy gate electrode layer to aid in the patterning. In some embodiments, a hard mask pattern including bottom masks 216 over a blanket layer of polysilicon and top masks 218 over the bottom masks 216. The hard mask pattern is made of one or more layers of $SiO_2$, SiCN, SiON, $Al_2O_3$, SiN, or other suitable materials. In certain embodiments, the bottom masks 216 include silicon oxide, and the top masks 218 include silicon nitride. By using the mask pattern as an etching mask, the dummy gate electrode layer is patterned into the dummy gate electrodes 214, and the blanket gate dielectric layer is patterned into the dummy gate dielectric layers 212.

Figure 6:
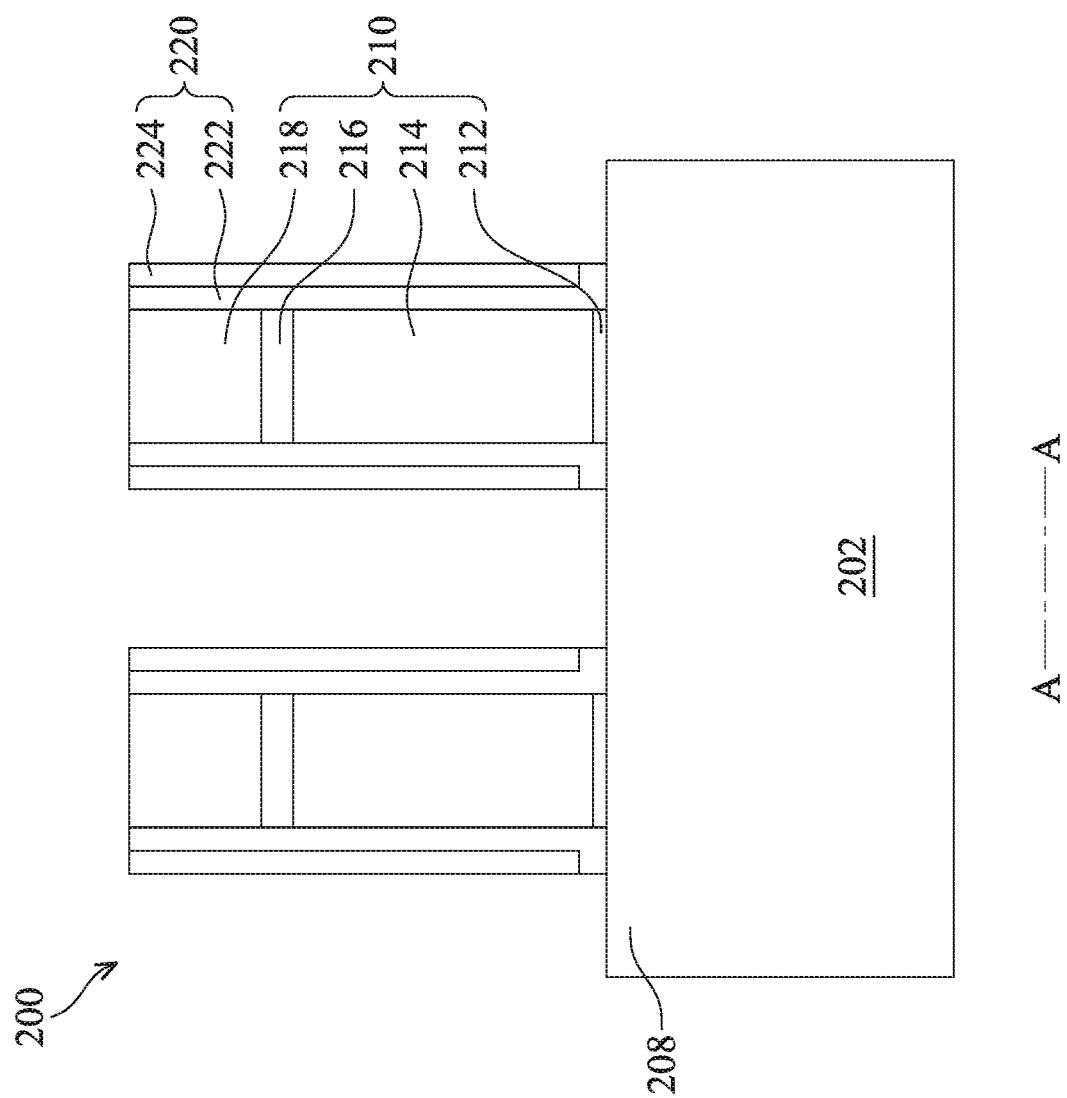

At operation 108, the method 100 (FIG. 1) forms gate spacers 220 on sidewalls of the dummy gate structures 210 as shown in FIG. 6. In some embodiments of the gate spacer formation, a spacer material layer is deposited on the substrate 202. The spacer material layer may be a conformal layer that is subsequently etched back to form gate spacers 220. In some embodiments, the spacer material layer includes multiple layers, such as a first spacer layer 222 and a second spacer layer 224 formed over the first spacer layer 222. The first and second spacer layers 222 and 224 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 222 and 224 may be formed by depositing in sequence two different dielectric materials over the dummy gate structures 210 using processes such as, CVD process, a subatmospheric CVD (SACVD) process, a flowable CVD process, an ALD process, a PVD process, or other suitable process. An anisotropic etching process is then performed on the deposited spacer layers 222 and 224 to expose portions of the fins 208 not covered by the dummy gate structures 210 (e.g., in source/drain regions of the fins 208). Portions of the first and second spacer layers 222 and 224 directly above the dummy gate structures 210 may be removed by this anisotropic etching process. Portions of the first and second spacer layer 222 and 224 on sidewalls of the dummy gate structures 210 may remain, forming gate sidewall spacers, which are denoted as the gate spacers 220, for the sake of simplicity. In some embodiments, the first spacer layer 222 is formed of silicon oxide that has a lower dielectric constant than silicon nitride, and the second spacer layer 224 is formed of silicon nitride that has a higher etch resistance against subsequent etching processing (e.g., etching source/drain recesses in the fins 208) than silicon oxide. In some embodiments, the gate spacers 220 may be used to offset subsequently formed doped regions, such as source/drain regions. The gate spacers 220 may further be used for designing or modifying the source/drain region profile.

Figure 7:
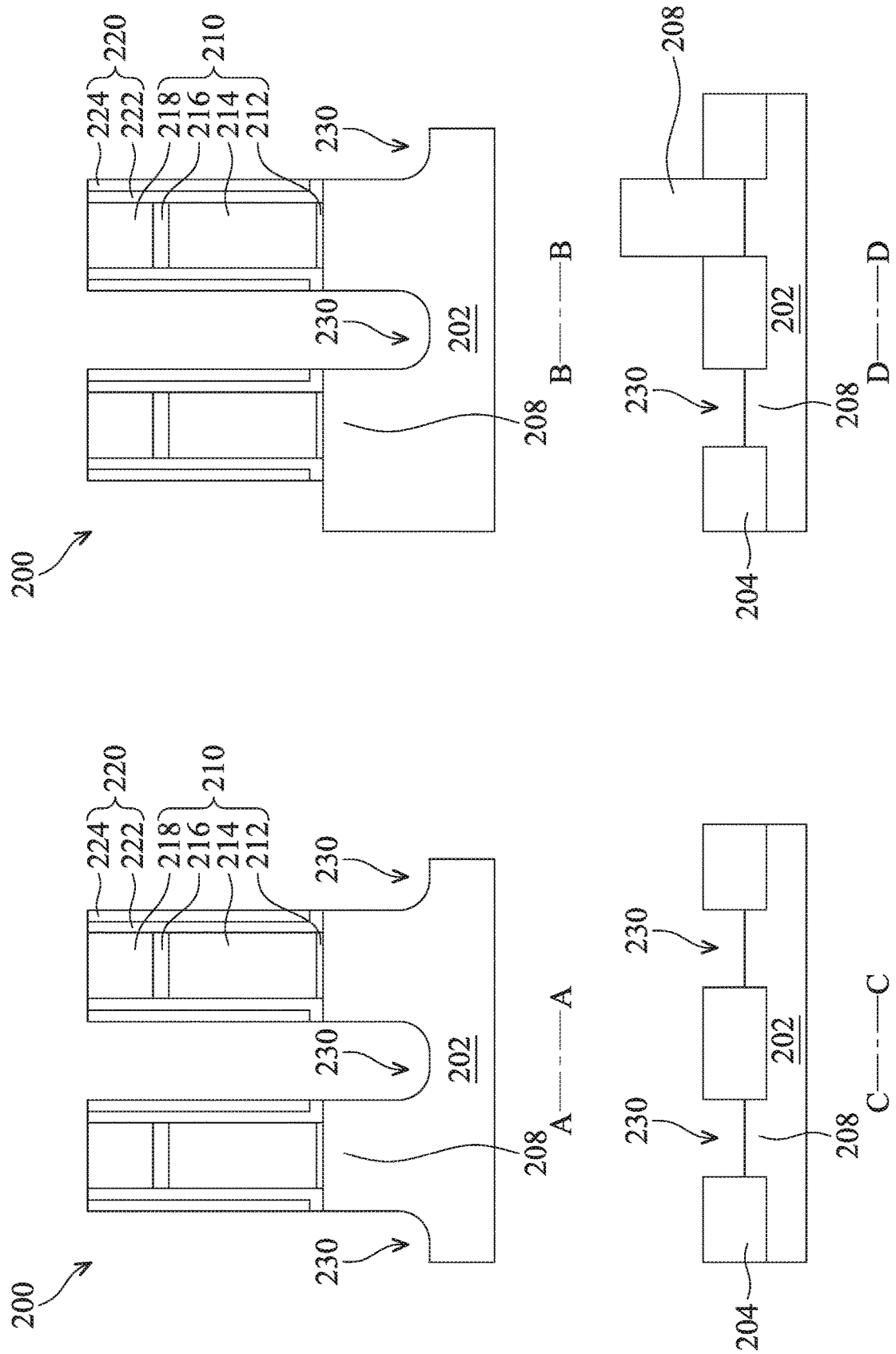

At operation 110, the method 100 (FIG. 1) forms S/D recesses 230 by recessing S/D regions of the fins 208 that are not covered by the dummy gate structures 210 and the gate spacers 220 as shown in FIG. 7. FIG. 7 illustrates a first cross-sectional view obtained from a first vertical plane containing line A-A in FIG. 4, a second cross-sectional view obtained from a second vertical plane containing line B-B in FIG. 4, a third cross-sectional view obtain from a third vertical plan containing line C-C in FIG. 4, and a fourth cross-sectional view obtained from a fourth vertical plane containing line D-D in FIG. 4. In FIG. 4, line A-A cuts into one of the fins 208 along a lengthwise direction of the fin, line B-B cuts into another fin 208 along a lengthwise direction of the fin, line C-C cuts into a S/D region on one side of a dummy gate structure 210 along a direction perpendicular to the lengthwise direction of the fins 208, and line D-D cuts into another S/D region on another side of the dummy gate structure 210 along the direction perpendicular to the lengthwise direction of the fins 208. Comparison among the cross-sectional views illustrates that not all S/D regions of the fins 208 need to be recessed. One or more particular S/D regions of the fins 208 not covered by the dummy gate structures 210 and the gate spacers 220 may be preserved (e.g., by depositing a mask layer above the selected S/D regions) to remain intact from the recessing process in order to fit certain circuit design needs. The second cross-sectional view along line B-B and the fourth cross-sectional view along line D-D illustrate one of such preserved S/D regions without forming an S/D recess therein. The other source/drain regions of the fins 208 can be recessed using suitable selective etching processing that etches semiconductor materials of the fins 208, but barely etches the dielectric materials gate spacers 220 and the top masks 218 of the dummy gate structures 210.

For example, recessing the fins 208 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the fins 208 at a faster etch rate than it etches the gate spacers 220 and the top masks 218 of the dummy gate structures 210. In some other embodiments, recessing the fins 208 may be performed by a wet chemical etch, such as ammonium peroxide mixture (APM), $NH_4OH$, tetramethylammonium hydroxide (TMAH), combinations thereof, or the like, which etches the fins 208 at a faster etch rate than it etches the gate spacers 220 and the top masks 218 of the dummy gate structures 210. In some other embodiments, recessing the fins 208 may be performed by a combination of a dry chemical etch and a wet chemical etch. In the illustrated embodiment, the recessed fins 208 is below a top surface of the isolation structure 204.

Figure 8:
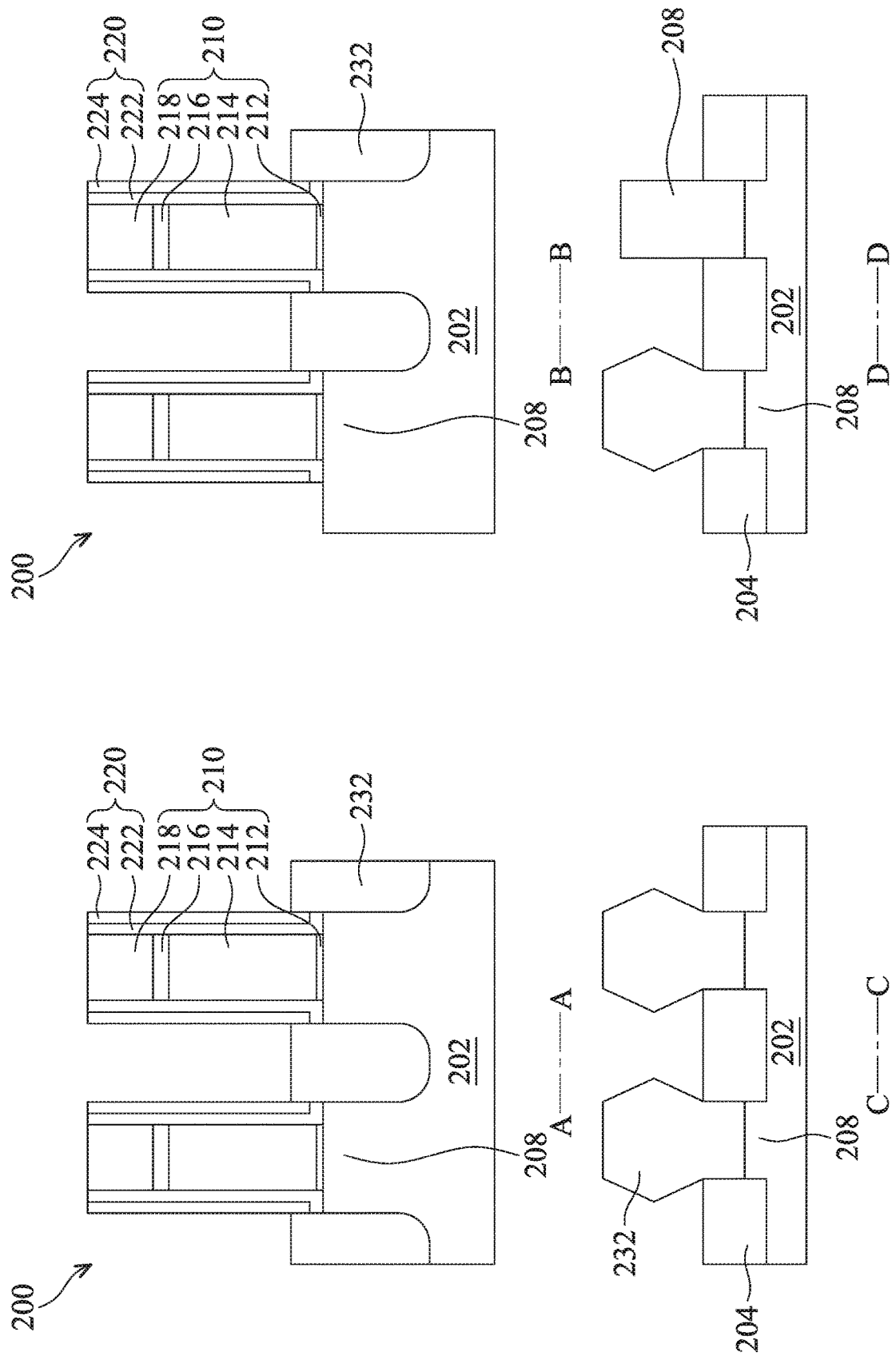

At operation 112, the method 100 (FIG. 1) forms epitaxial structures 232 in the S/D recesses 230 as shown in FIG. 8. Once S/D recesses 230 are created in the S/D regions of the fins 208, epitaxial structures 232 are formed in the S/D recesses 230 by using one or more epitaxy or epitaxial processes that provides one or more epitaxial materials on the fins 208. During the epitaxial growth process, the gate spacers 220 (as well as a mask layer (not shown) above certain selected S/D regions to preserve a fin structure) limit the one or more epitaxial materials to S/D recesses 230 in the fins 208. In some embodiments, the lattice constants of the epitaxy structures 232 are different from the lattice constant of the fins 208, so that the channel region in the fins 208 and between the epitaxy structures 322 can be strained or stressed by the epitaxy structures 232 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 208. The epitaxy structures 232 are also referred to as S/D features 232.

In some embodiments, the S/D features 232 may include Ge, Si, GaAs, AlGaAs, SiGe, GaAsP, SiP, or other suitable material. The S/D features 232 may be in-situ doped during the epitaxial process by introducing doping species including: p-type dopants, such as boron or $BF_2$; n-type dopants, such as phosphorus or arsenic; and/or other suitable dopants including combinations thereof. If the S/D features 232 are not in-situ doped, an implantation process (i.e., a junction implant process) is performed to dope the S/D features 232. In some exemplary embodiments, the S/D features 232 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 208 in the p-type device regions. The mask may then be removed. Subsequently, a mask, such as a photoresist, may be formed over the p-type device region while exposing the n-type device regions, and n-type epitaxial structures may be formed on the exposed fins 208 in the n-type device region. The mask may then be removed.

Once the source/drain epitaxial structures 232 are formed, an annealing process can be performed to activate the p-type dopants or n-type dopants in the S/D features 232. The annealing process may be, for example, a rapid thermal anneal (RTA), a laser anneal, a millisecond thermal annealing (MSA) process or the like.

Figure 9:
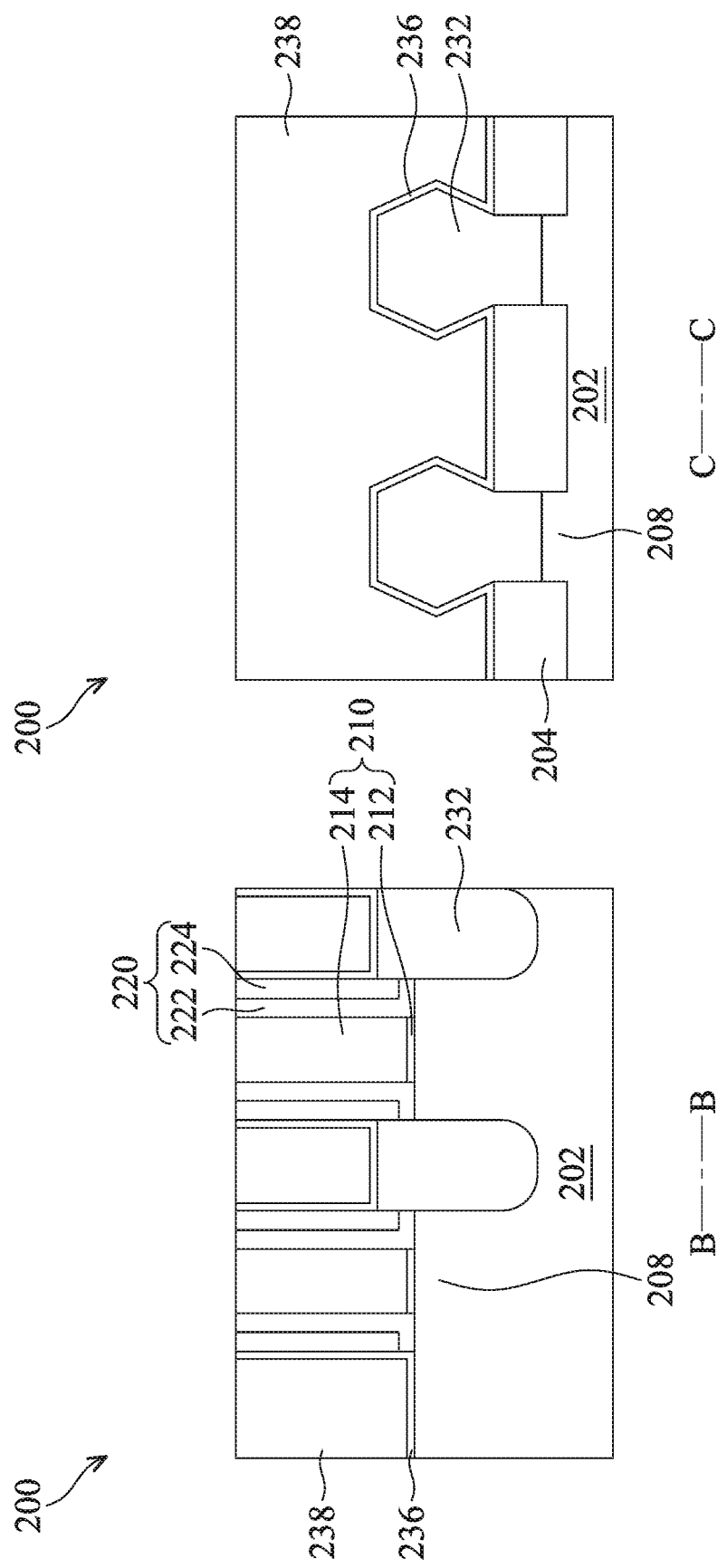

At operation 114, the method 100 (FIG. 1) forms a contact etch stop layer (CESL) 236 and an interlayer dielectric (ILD) layer 238 on the substrate 202 as shown in FIG. 9. Due to similarities between different cross-sectional views, FIG. 9 and subsequent figures illustrate cross-sectional views containing lines B-B and C-C unless specified differently for the sake of simplicity. In some examples, the CESL 236 includes a silicon nitride layer, silicon oxide layer, a silicon oxynitride layer, and/or other suitable materials having a different etch selectivity than the ILD layer 238. The CESL 236 may be formed by plasma-enhanced chemical vapor deposition (PECVD) process and/or other suitable deposition or oxidation processes. In some embodiments, the ILD layer 238 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 238 may be deposited by a PECVD process or other suitable deposition technique. In some embodiments, after formation of the ILD layer 238, the wafer may be subject to a high thermal budget process to anneal the ILD layer 238.

In some examples, after forming the ILD layer 238, a planarization process may be performed to remove excessive materials of the ILD layer 238. For example, a planarization process includes a chemical mechanical planarization (CMP) process which removes portions of the ILD layer 238 (and the CESL 236, if present) overlying the dummy gate structures 210. In some embodiments, the CMP process also removes hard mask layers 216, 218 and exposes the dummy gate electrodes 214.

Figure 10:
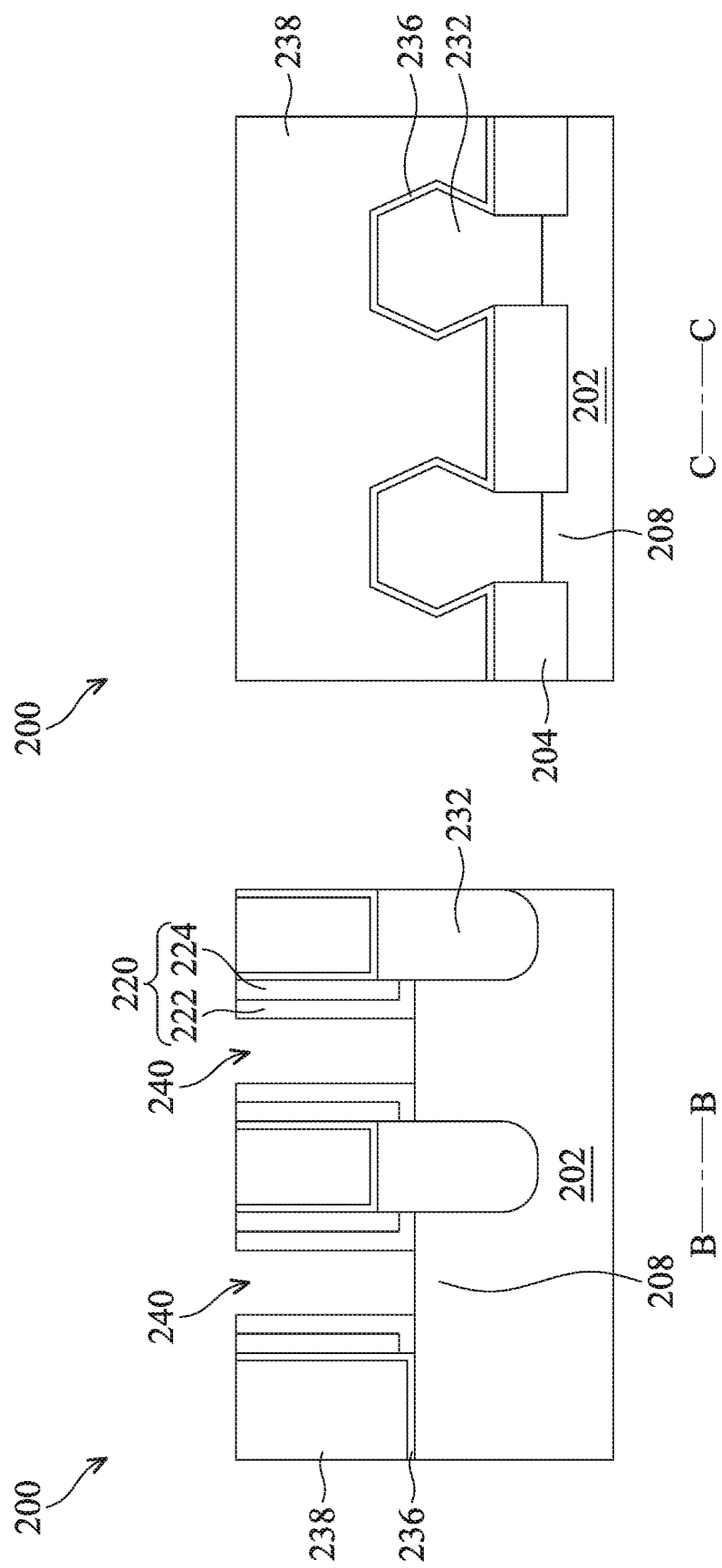

At operation 116, the method 100 (FIG. 1) removes the remaining dummy gate structures 210, resulting in gate trenches 240 between corresponding gate sidewall spacers 220 as shown in FIG. 10. The dummy gate structures 210 are removed using a selective etching process (e.g., selective dry etching, selective wet etching, or a combination thereof) that etches materials in the dummy gate structures 210 at a faster etch rate than it etches other materials (e.g., the gate sidewall spacers 220, the CESL 236, and/or the ILD layer 238).

Figure 11:
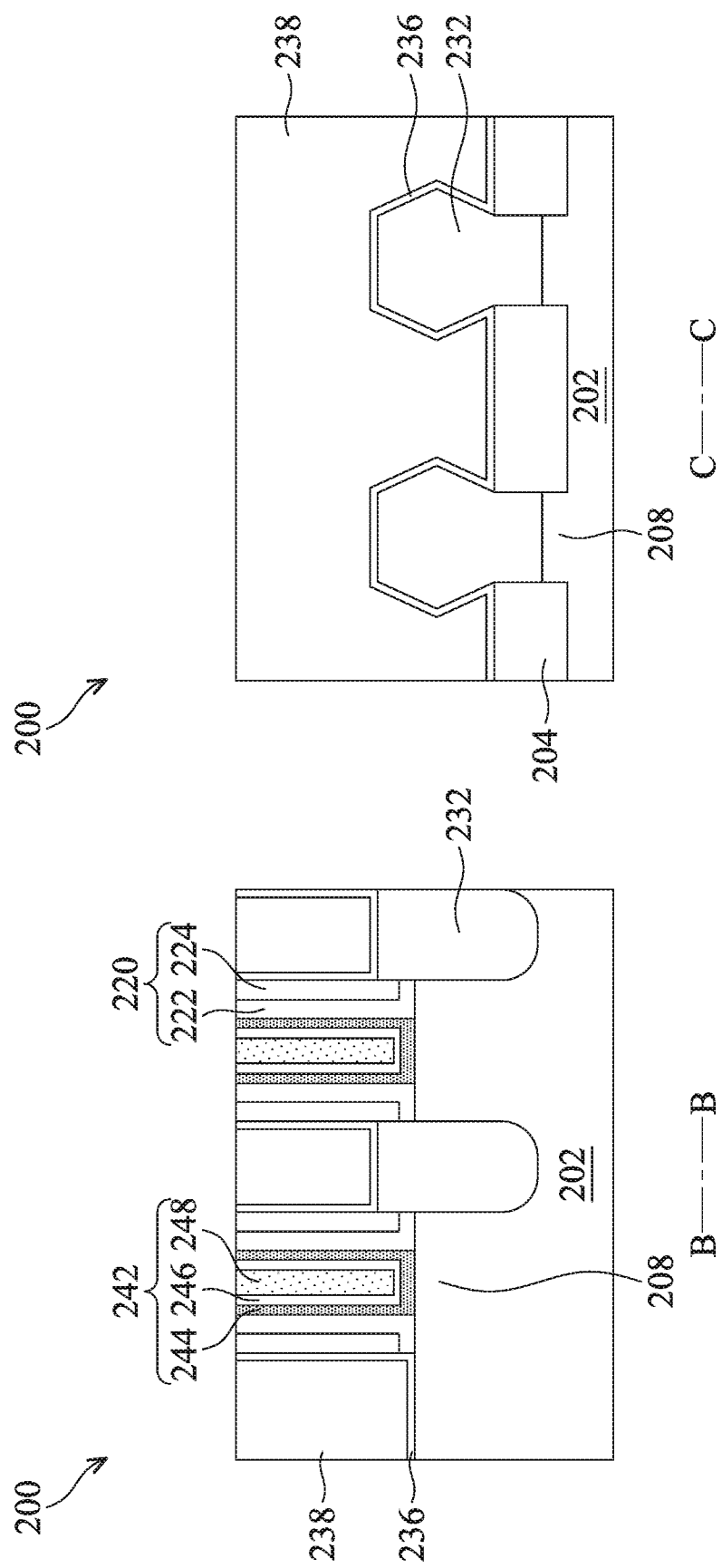

At operation 118, the method 100 (FIG. 1) forms replacement gate structures 242 in the gate trenches 240 as shown in FIG. 11. The gate structures 242 may be the final gates of FinFETs. The final gate structures each may be a high-k/metal gate stack (or metal gate stack), however other compositions are possible. In some embodiments, each of the gate structures 242 forms the gate associated with the three-sides of the channel region provided by the fin 208. Stated another way, each of the gate structures 242 wraps around the fin 208 on three sides. In various embodiments, the high-k/metal gate structure 242 includes a gate dielectric layer 244 lining the gate trenches 240, a work function metal layer 246 formed over the gate dielectric layer 244, and a fill metal 248 formed over the work function metal layer 246 and filling a remainder of gate trenches 240. The gate dielectric layer 244 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 246 and/or the fill metal 248 within the high-k/metal gate structures 242 may include a metal, metal alloy, or metal silicide. Formation of the high-k/metal gate structures 242 may include multiple deposition processes to form various gate materials, one or more liner layers, and one or more CMP processes to remove excessive gate materials.

In some embodiments, the interfacial layer of the gate dielectric layer 244 may include a dielectric material such as silicon oxide ($SiO_2$), HfSiO, or silicon oxynitride (SION). The interfacial layer may be formed by chemical oxidation, thermal oxidation, atomic layer deposition (ALD), chemical vapor deposition (CVD), and/or other suitable method. The high-k dielectric layer of the gate dielectric layer 244 may include hafnium oxide ($HfO_2$). Alternatively, the gate dielectric layer 244 may include other high-k dielectrics, such as hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 246 may include work function metals to provide a suitable work function for the high-k/metal gate structures 242. For an n-type FinFET, the work function metal layer 246 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 246 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 248 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12:
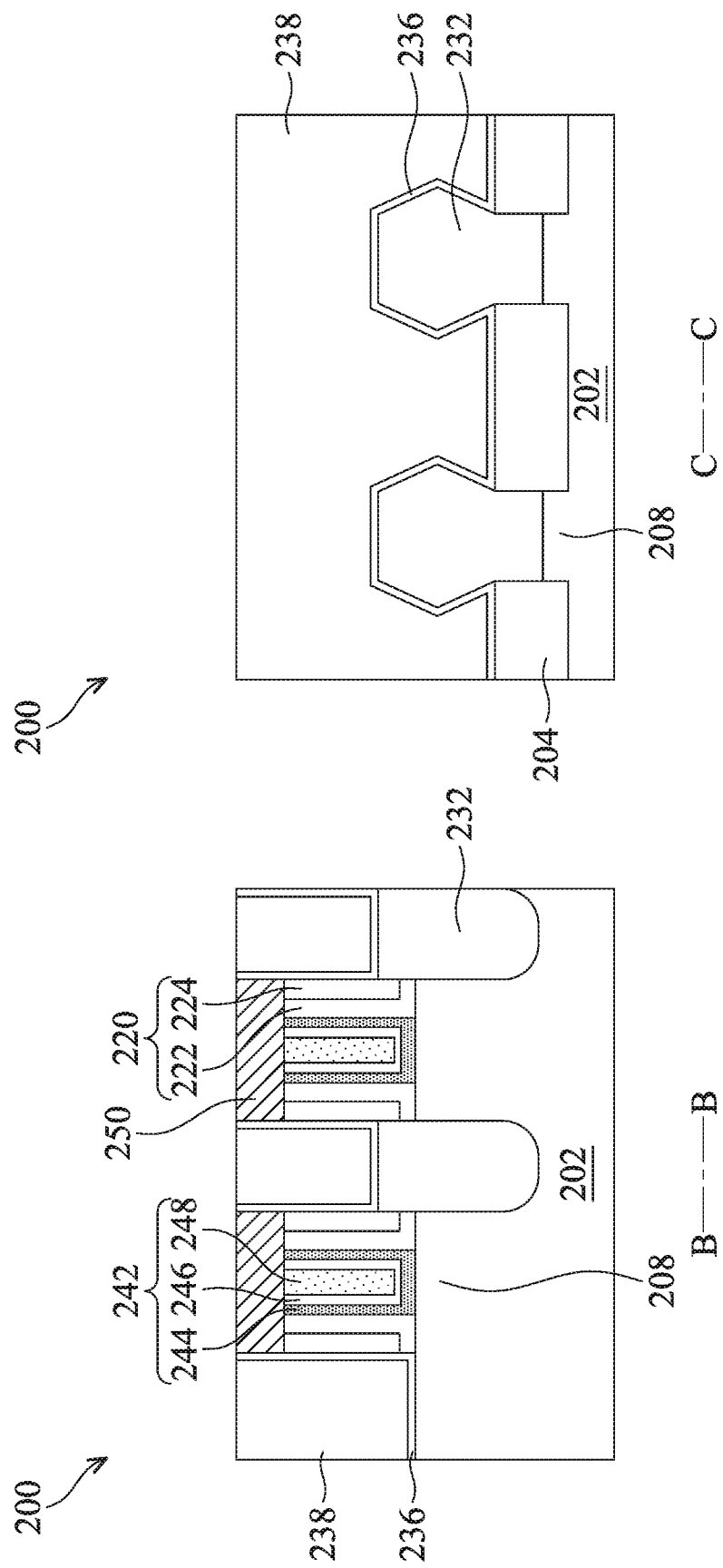
Figure 13:
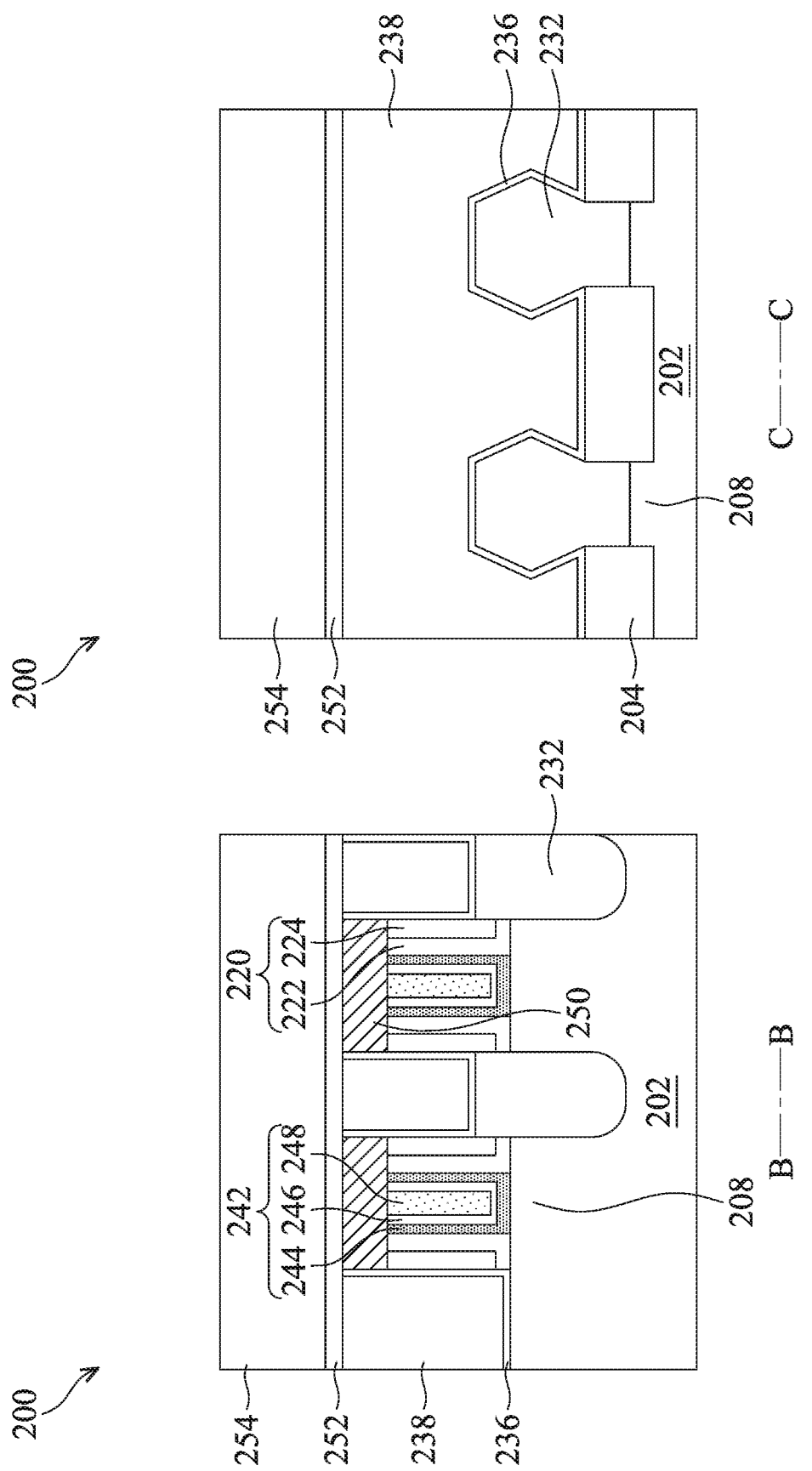

At operation 120, the method 100 (FIG. 1) etches back the replacement gate structures 242 and deposits gate cap layer 250 over the etched-back replacement gate structures 242 as shown in FIG. 12. An etching back process is performed to etch back the replacement gate structures 242 and the gate spacers 220, resulting in recesses over the etched-back gate structures 242 and the etched-back gate spacers 220. In some embodiments, because the materials of the replacement gate structures 242 have a different etch selectivity than the gate spacers 220, a first selective etching process may be initially performed to etch back the replacement gate structures 242 to lower the replacement gate structures 242. Then, a second selective etching process is performed to lower the gate spacers 220. Next, a dielectric cap layer 250 is deposited over the substrate 202 until the recesses are overfilled. The dielectric cap layer 250 includes SiN, SiC, SiCN, SiON, SiCON, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the dielectric cap layer outside the recesses, leaving portions of the dielectric cap layer 250 in the recesses to serve as the gate cap layer 250.

At operation 122, the method 100 (FIG. 1) forms a middle contact etch stop layer (MCESL) 252 over the substrate 202 and a second ILD layer 254 over the MCESL 252 as shown in FIG. 12. The MCESL 252 may be formed by a PECVD process and/or other suitable deposition processes. In some embodiments, the MCESL 252 is a silicon nitride layer and/or other suitable materials having a different etch selectivity than the subsequently formed second ILD layer 254.

The second ILD layer 254 is formed over the MCESL 252. In some embodiments, the second ILD layer 254 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the MCESL 252. In certain embodiments, the second ILD layer 254 is formed of silicon oxide. The second ILD layer 254 may be deposited by a PECVD process or other suitable deposition technique.

Figure 14:
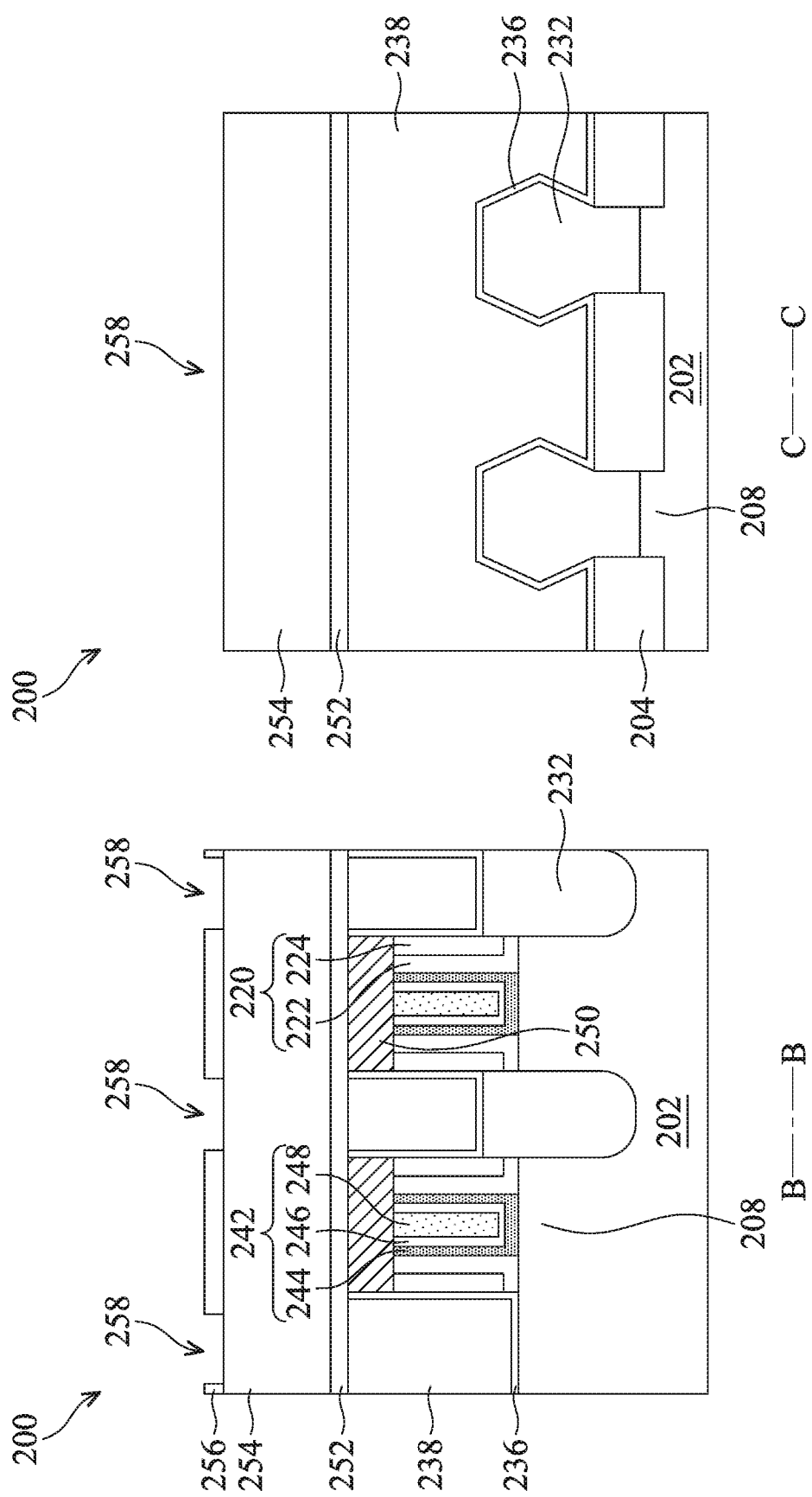

At operation 124, the method 100 (FIG. 1) forms an etch mask 256 over the second ILD layer 254 as shown in FIG. 14. The etch mask 256 provides openings 258 over the S/D features 232. The etch mask 256 includes a material that is different than a material of the second ILD layer 254 to achieve etching selectivity. For example, the etch mask 256 includes a resist material (and thus may be referred to as a patterned resist layer and/or a patterned photoresist layer). In some embodiments, the etch mask 256 has a multi-layer structure, such as a resist layer disposed over an anti-reflective coating (ARC) layer and/or a hard mask layer comprising silicon nitride or silicon oxide. The present disclosure contemplates other materials for the etch mask 256, so long as etching selectivity is achieved during the etching of the second ILD layer 254. In some embodiments, operation 124 uses a lithography process that includes forming a resist layer over the structure 200 (e.g., by spin coating), performing a pre-exposure baking process, performing an exposure process using a mask, performing a post-exposure baking process, and performing a developing process. During the exposure process, the resist layer is exposed to radiation energy (e.g., UV light, DUV light, or EUV light), where the mask blocks, transmits, and/or reflects radiation to the resist layer depending on a mask pattern of the mask and/or mask type (e.g., binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer (e.g., the etch mask 256) includes a resist pattern that corresponds with the mask. Alternatively, the exposure process can be implemented or replaced by other methods, such as maskless lithography, e-beam writing, ion-beam writing, or combinations thereof.

Figure 15:
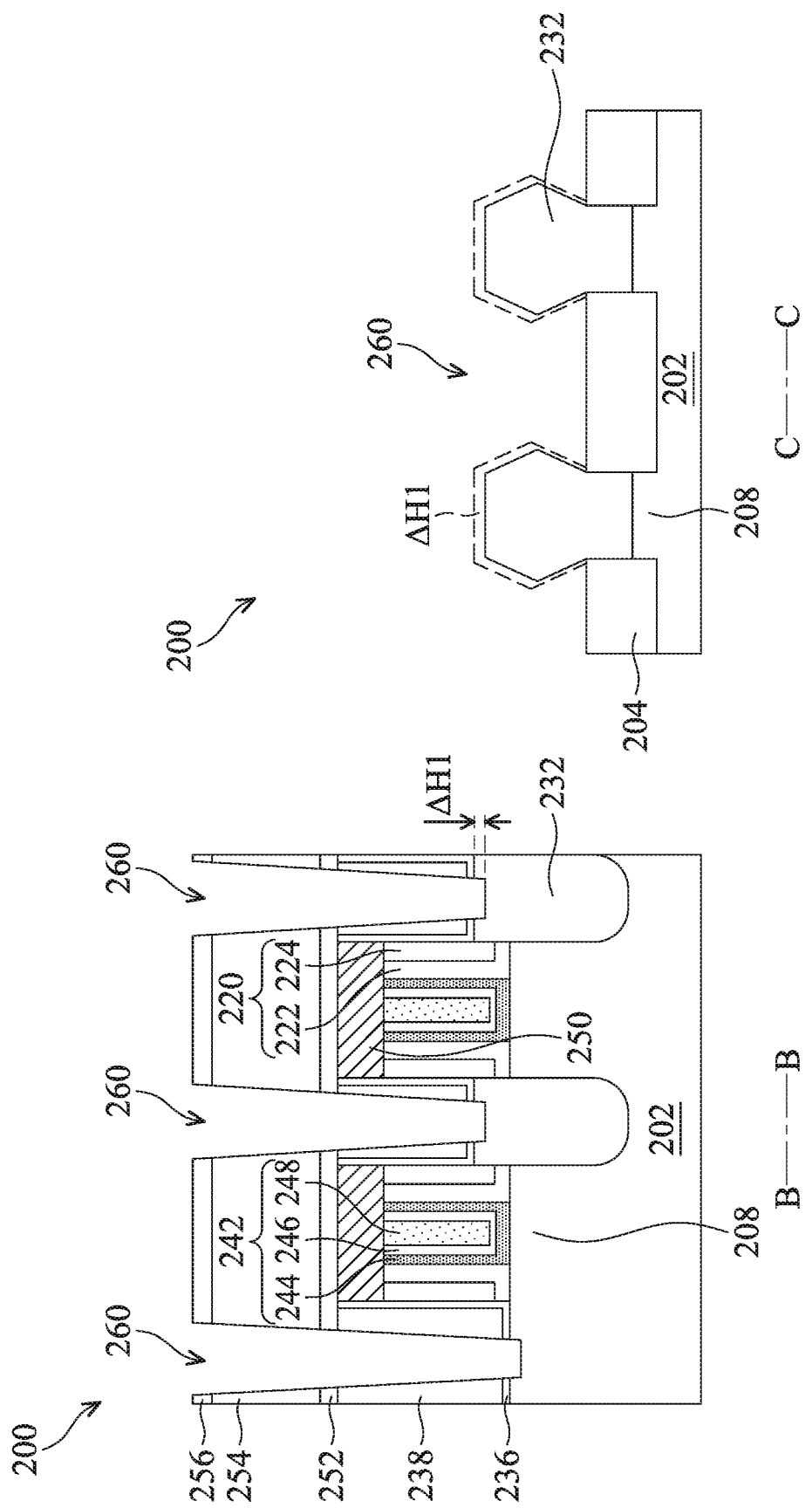

At operation 126, the method 100 (FIG. 1) forms contact openings 260 through the second ILD layer 254, MCESL 252, first ILD 238, CESL 236 and exposing the S/D feature 232 as shown in FIG. 15. In some embodiments, the operation 126 may apply more than one etching processes. For example, a first etching process is performed to punch through the second ILD layer 254 and the MCESL 252, a second etching process is performed to punch through the first ILD layer 238 and the CESL 236, and optionally a third etching process is performed to over etch the S/D features 232 (and the un-recessed S/D region of the fin 208 if presented). In furtherance of embodiments, each of the first and second etching processes is an anisotropic etching process, such as a plasma etching. Take plasma etching for example, the structure 200 is loaded into a plasma tool and exposed to a plasma environment generated by RF or microwave power in a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch through the dielectric layers. The first and second etching processes may use different etchants to achieve suitable etching rates. The third etching process may be different from the first and second etching processes. The third etching process can be dry etching, wet etching, reactive ion etching, or other suitable etching methods, to selectively recess the exposed S/D features 232 for a thickness denoted as ΔH1. ΔH1 may range from about 3 nm to about 30 nm in some embodiments. The recessing creates a notch (as shown in cross-sectional view containing cutline B-B) on the top surface of the exposed S/D features 232 for preparing the exposed S/D features 232 for subsequent silicide formation. The recessing may also trim down a width and a volume of the exposed S/D features 232 (as shown in cross-sectional view containing cutline C-C).

After the series of etching processes, the openings defined in the etch mask 256 is downward extended though the second ILD layer 254, MCESL 252, first ILD 238, CESL 236. The openings are denoted as contact openings 260. The etch mask 256 is subsequently removed, for example, by a resist stripping process or other suitable process. In the depicted embodiment, the contact openings 260 have tapered sidewall profile due to the nature of anisotropic etching. However, in some other embodiments, the etching conditions may be fined-tune to allow the contact openings 260 having vertical sidewall profile. As illustrated in the cross-sectional view containing cutline C-C, the contact openings 260 expose a row of S/D features 232 between two adjacent metal gate structures 242. Further, the contact openings 260 expose not just the top surface but also the sidewalls (e.g., facets) of the S/D features 232 that are not covered by the isolation structure 204. Due to the trench shape of the contact openings 260 in a top view, the contact openings 260 are also referred to as contact trenches 260.

Figure 16:
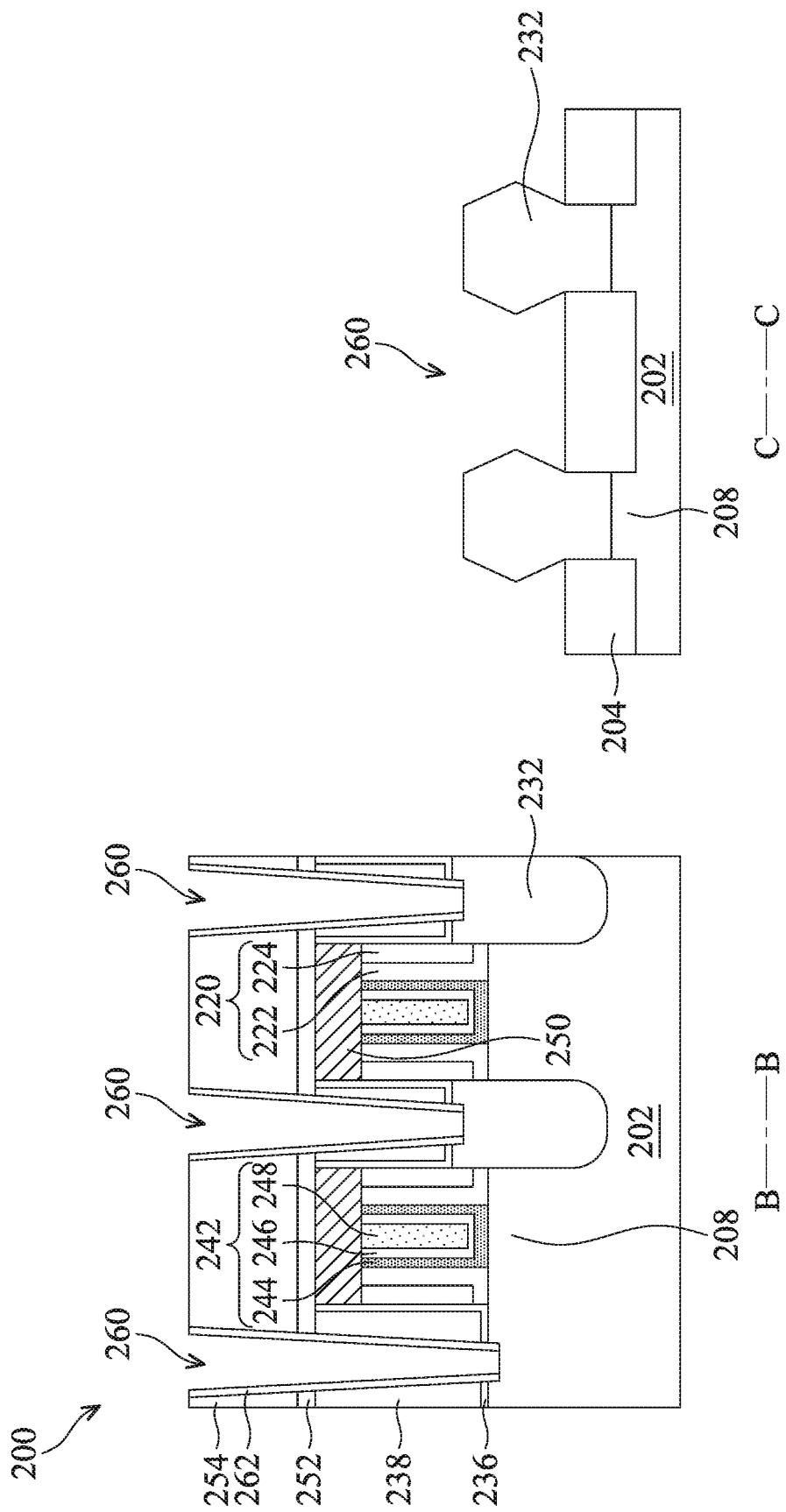

At operation 128, the method 100 (FIG. 1) forms contact spacers 262 on sidewalls of the contact openings 260 as shown in FIG. 16. The contact spacers 262 may be formed of a high-k dielectric material, so that it has good isolation ability. Suitable high-k dielectric materials may include $Al_xO_y$, $HfO_2$, SiN, and SiOCN (with no pores or substantially no pores inside). The formation of the contact spacers 262 may include a conformal deposition method such as CVD or ALD to form a blanket layer. An anisotropic etch is then performed, so that the horizontal portions of the blanket layer are removed. The vertical portions of the blanket layer remain on the sidewalls of contact openings 260 as the contact spacers 262.

Figure 17:
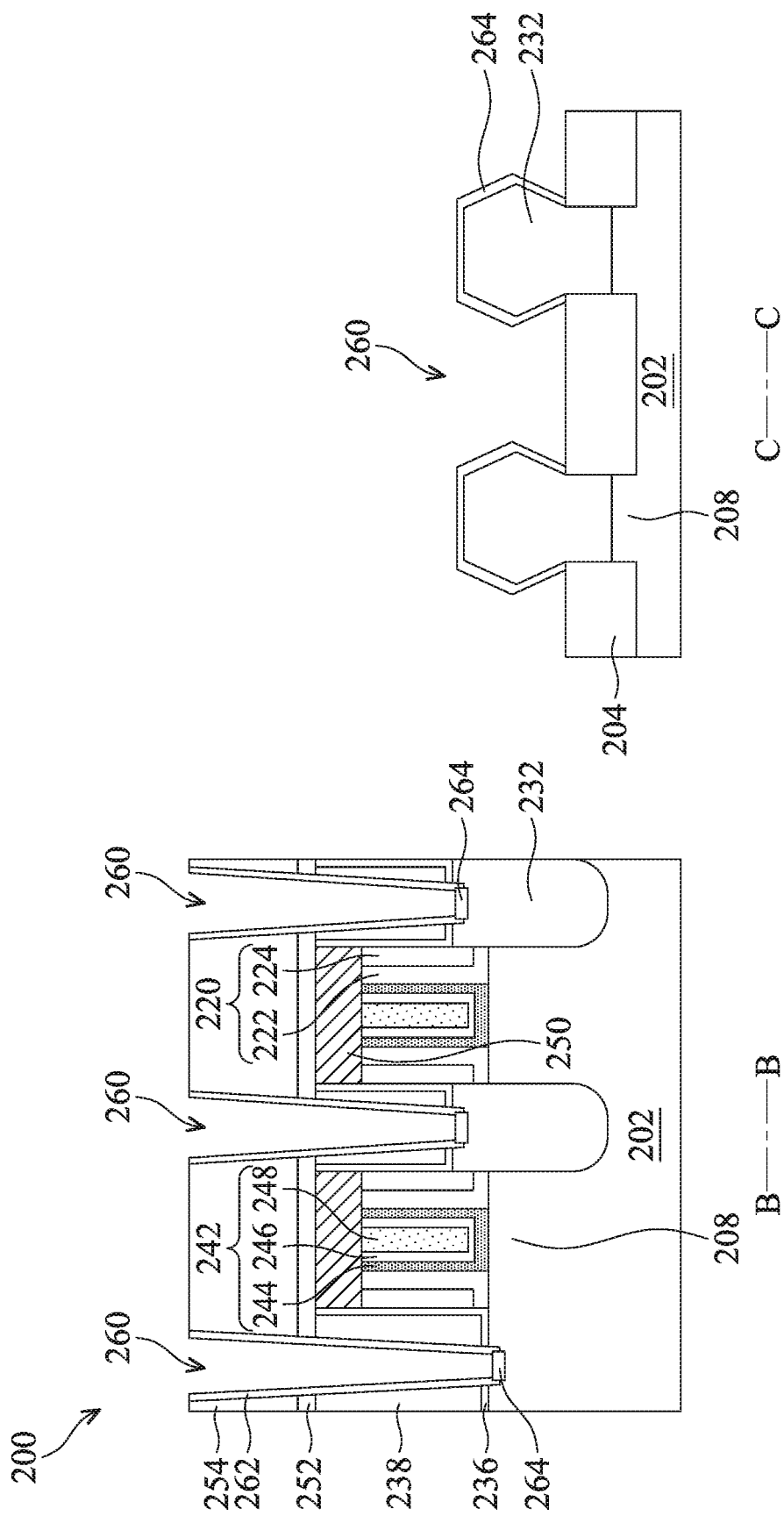

At operation 130, the method 100 (FIG. 1) forms a silicide feature 264 on exposed surfaces of the S/D features 232 (and the un-recessed S/D region of the fin 208 if presented, as shown in the cross-sectional view containing cutline B-B) as shown in FIG. 17. The silicide feature 264 reduces contact resistance between the S/D features 232 and the to-be-formed S/D contacts. In an embodiment, the silicide feature 264 is formed by depositing one or more metals into the contact openings 260, performing an annealing process to the structure 200 to cause reaction between the one or more metals and the semiconductor material of the exposed S/D features 232 (and the un-recessed fin 208 if presented) to produce the silicide feature, and removing un-reacted portions of the one or more metals, leaving the silicide feature on the bottom of the contact openings 260. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. As illustrated in the cross-sectional view containing cutline C-C, the silicide feature 264 covers the top surface and sidewalls (including upward-facing facets and downward-facing facets) of the S/D features 232. In furtherance of embodiments, the silicide feature 264 is also in contact with top surfaces of the isolation structure 204. In some embodiments, the silicide feature 264 has a thickness ranging from about 1 nm to about 15 nm.

Figure 18:
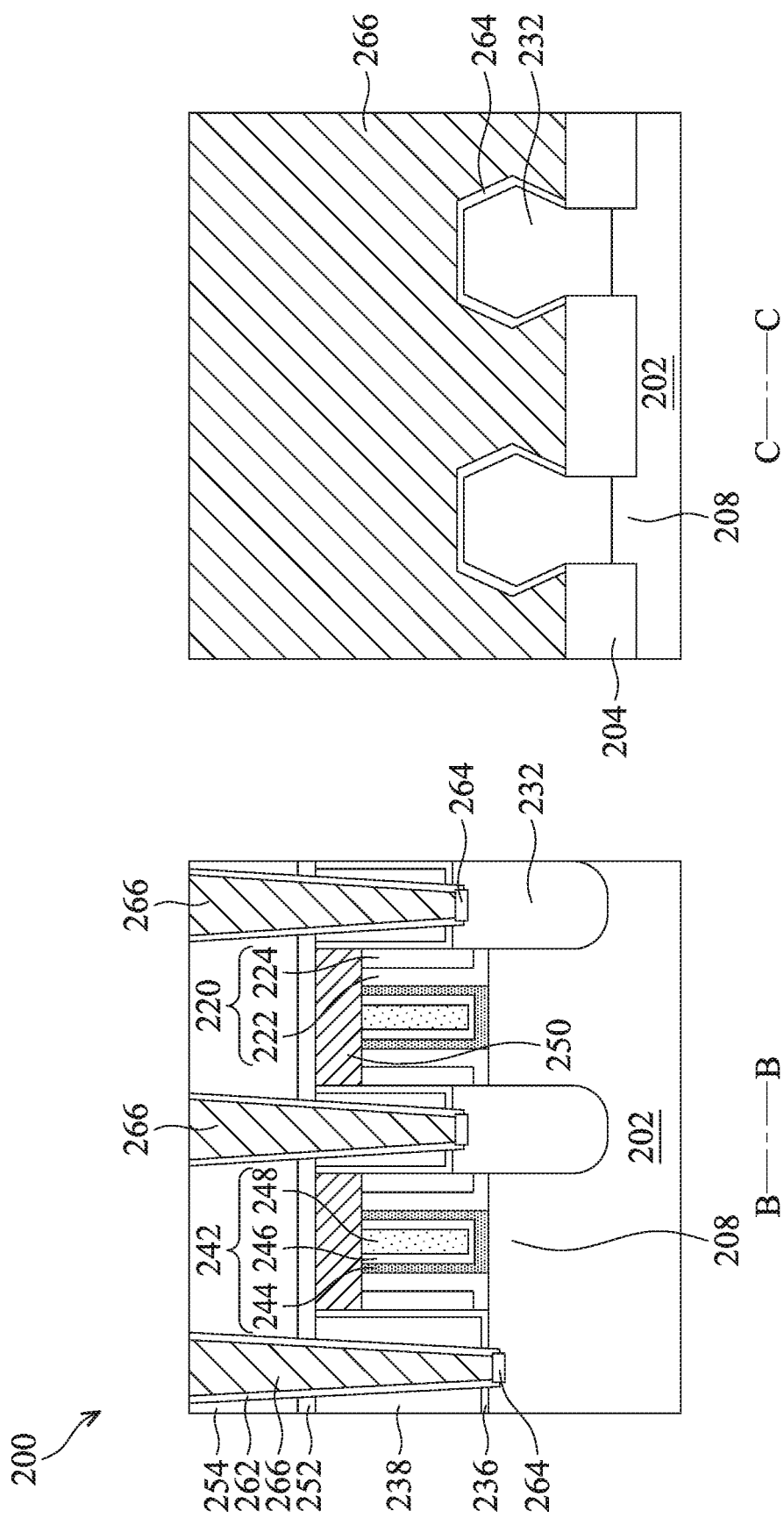

At operation 132, the method 100 (FIG. 1) forms S/D contacts 266 in the contact openings 260 as shown in FIG. 18. The S/D contacts 266 are deposited over the silicide feature 264 and in contact with the exposed top surfaces of the isolation structure 204. The S/D contacts 266 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. At the conclusion of the operation 132, the method 100 performs a planarization process, such as a CMP process, to remove excessive metallic materials from the structure 200 and expose the second ILD layer 254. As illustrated in the cross-sectional view containing cutline C-C, the S/D contact 266 is not just landing on the top surface but also wraps around the sidewalls of the S/D features 232. The expanded contact surface effectively reduces contact resistant in the S/D contact structures. Further, at the conclusion of the operation 132, the S/D contact 266 electrically connects a row of the S/D features 232 between two adjacent metal gate structure 242. Due to the slot shape of the S/D contact 266 in a top view, the S/D contact 266 is also referred to as S/D contact slot or S/D contact rail. The silicide feature 264 can also be considered as a part (e.g., a bottom portion) of the S/D contact rail.

Figure 19:
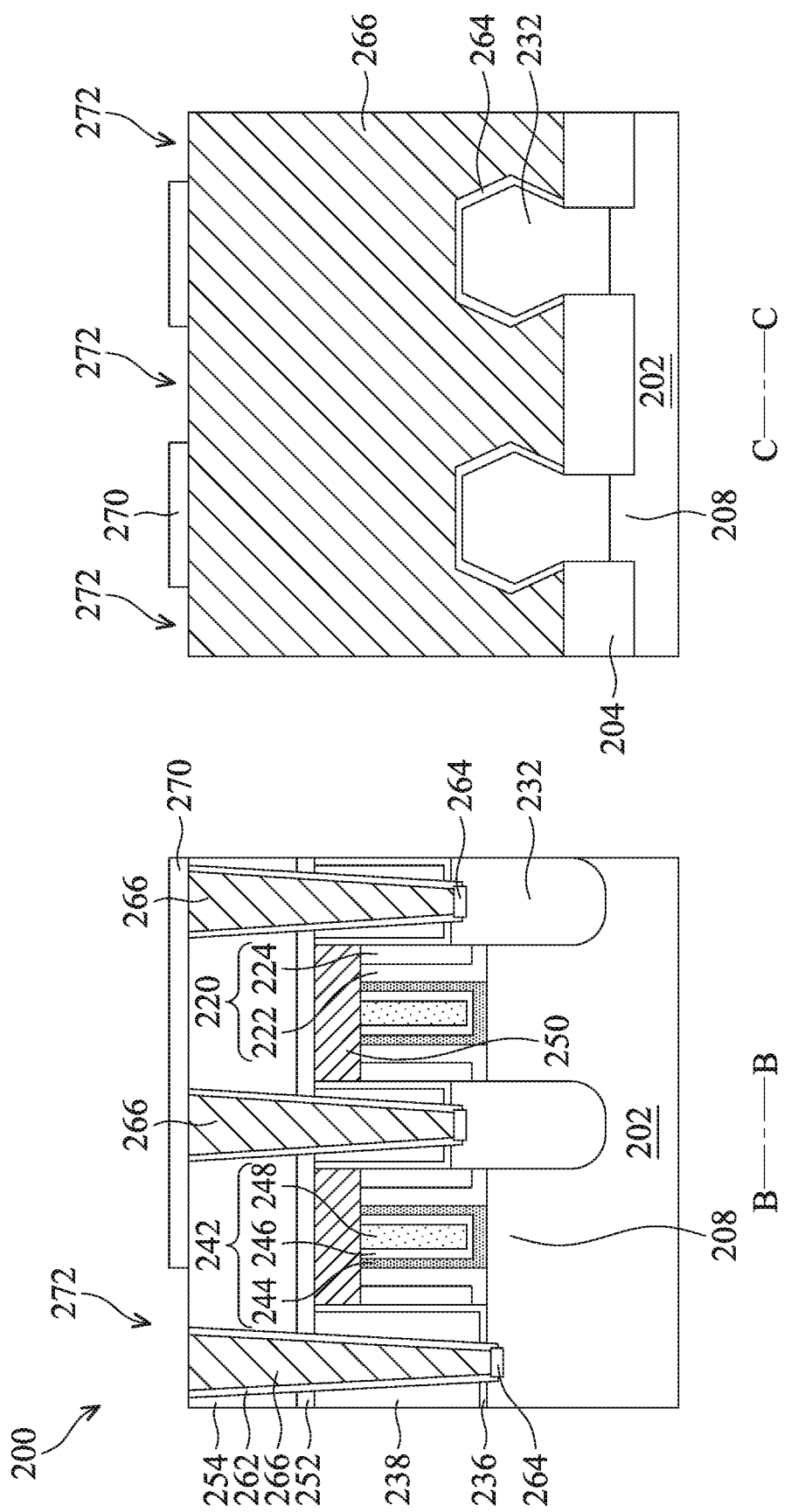

At operation 134, the method 100 (FIG. 1) forms an etch mask 270 over the second ILD layer 254 and the S/D contacts 266 as shown in FIG. 19. The etch mask 270 provides openings 272 over regions between adjacent S/D contacts 266 (including over the un-recessed S/D region of the fin 208 if presented, as shown in the cross-sectional view containing cutline B-B). The etch mask 270 may include a resist material (and thus may be referred to as a patterned resist layer and/or a patterned photoresist layer). In some embodiments, the etch mask 270 has a multi-layer structure, such as a resist layer disposed over an anti-reflective coating (ARC) layer and/or a hard mask layer comprising silicon nitride or silicon oxide. The material composition and formation process of the etch mask 270 may be substantially similar to the etch mask 256 discussed above with reference to FIG. 14.

Figure 20:
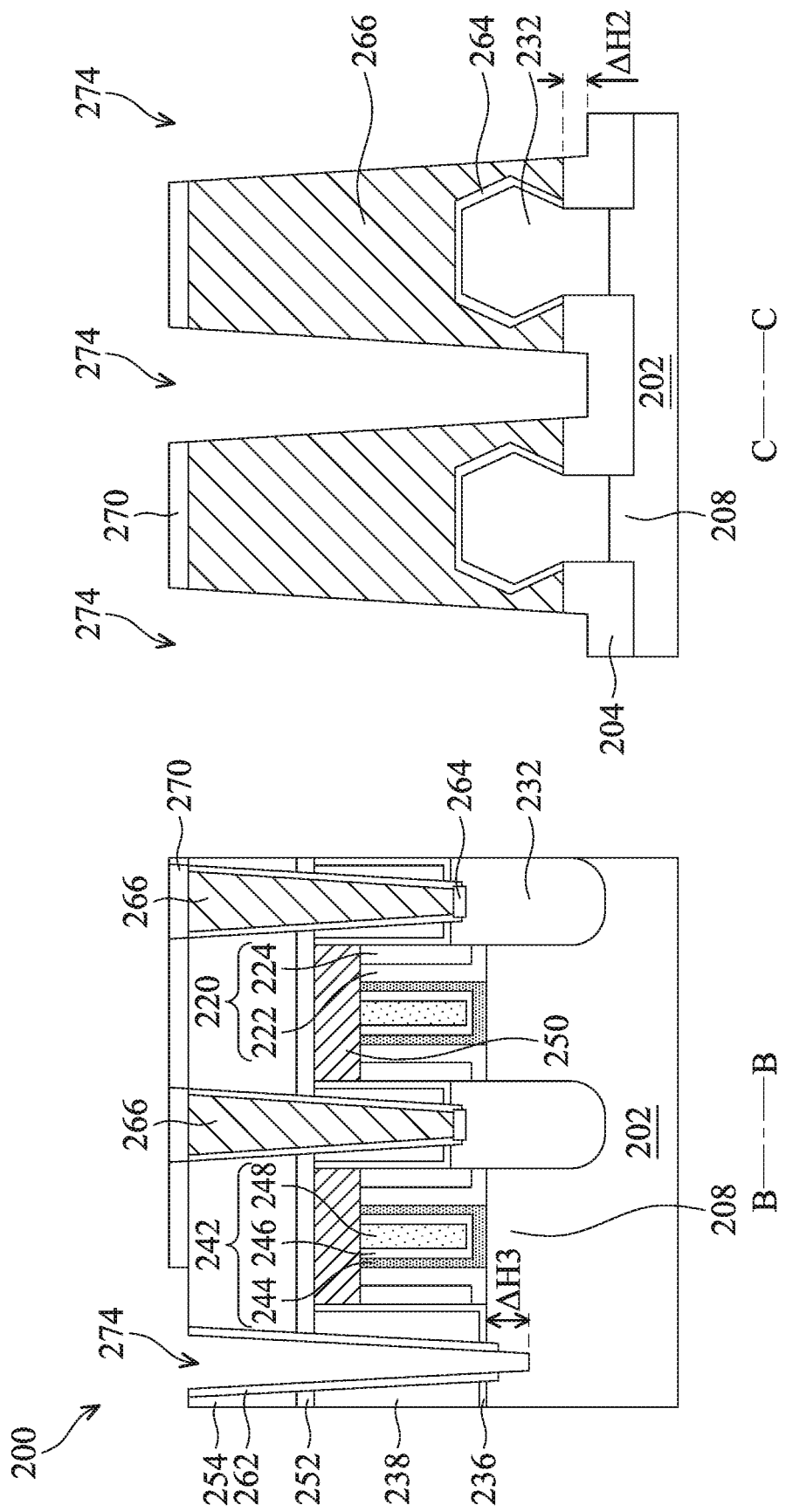

At operation 136, the method 100 (FIG. 1) etches the S/D contacts 266 through the openings defined in the etch mask 270 as shown in FIG. 20. The operation 136 extends the openings in the etch mask 270 down and through the S/D contacts 266 at locations between adjacent S/D features 232, and also into the isolation structure 204. The extended openings are denoted as cut-contact openings 274. The etch mask 270 is subsequently removed, for example, by a resist stripping process or other suitable process. The etching process may use one or more etchants or a mixture of etchants. In an exemplary embodiment, the operation 136 may apply an anisotropic etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. To ensure the isolation between the divided portions of the S/D contacts 266, the operation 136 performs some over-etching to extend the openings into the isolation structure 204 in some embodiments. Such over-etching is carefully controlled to not expose the substrate 202. Stated in other words, the over-etching ensures the completely dividing of the S/D contacts 266 into multiple segments with each segment as an individual S/D contact. A top surface of the isolation structure 204 is recessed for a thickness denoted as $\Delta H2$. $\Delta H2$ may range from about 10 nm to about 50 nm in some embodiments. The un-recessed S/D region of the fin 208 is exposed in the cut-contact opening 274 and recessed—with the removal of the respective silicide feature 264 exposed in the cut-contact opening 274—for a thickness denoted as $\Delta H3$. $\Delta H3$ may range from about 10 nm to about 50 nm in some embodiments. In furtherance of some embodiments, $\Delta H2$ may be different from $\Delta H3$ due to different etch rates.

Figure 21:
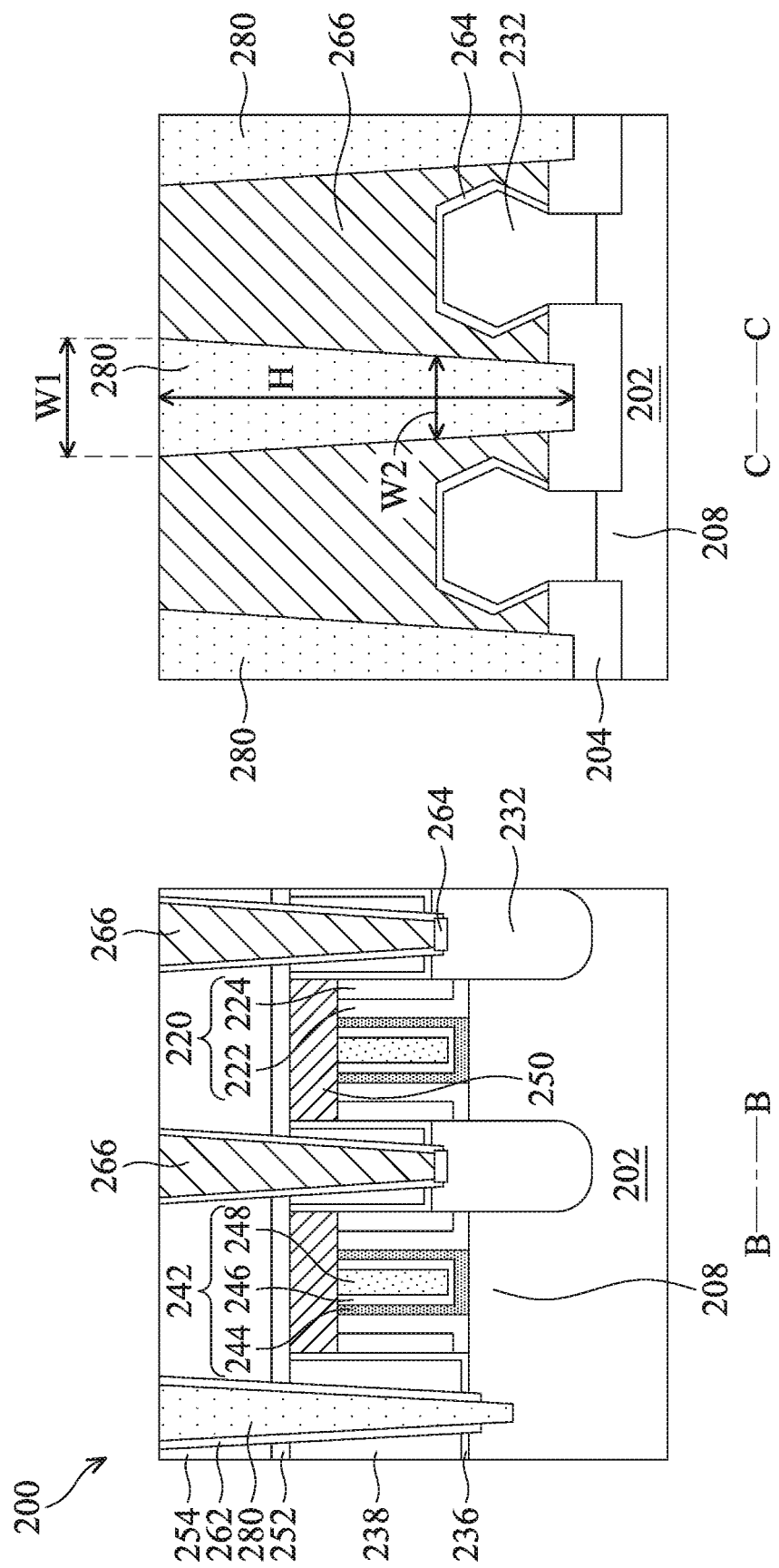
Figure 22:
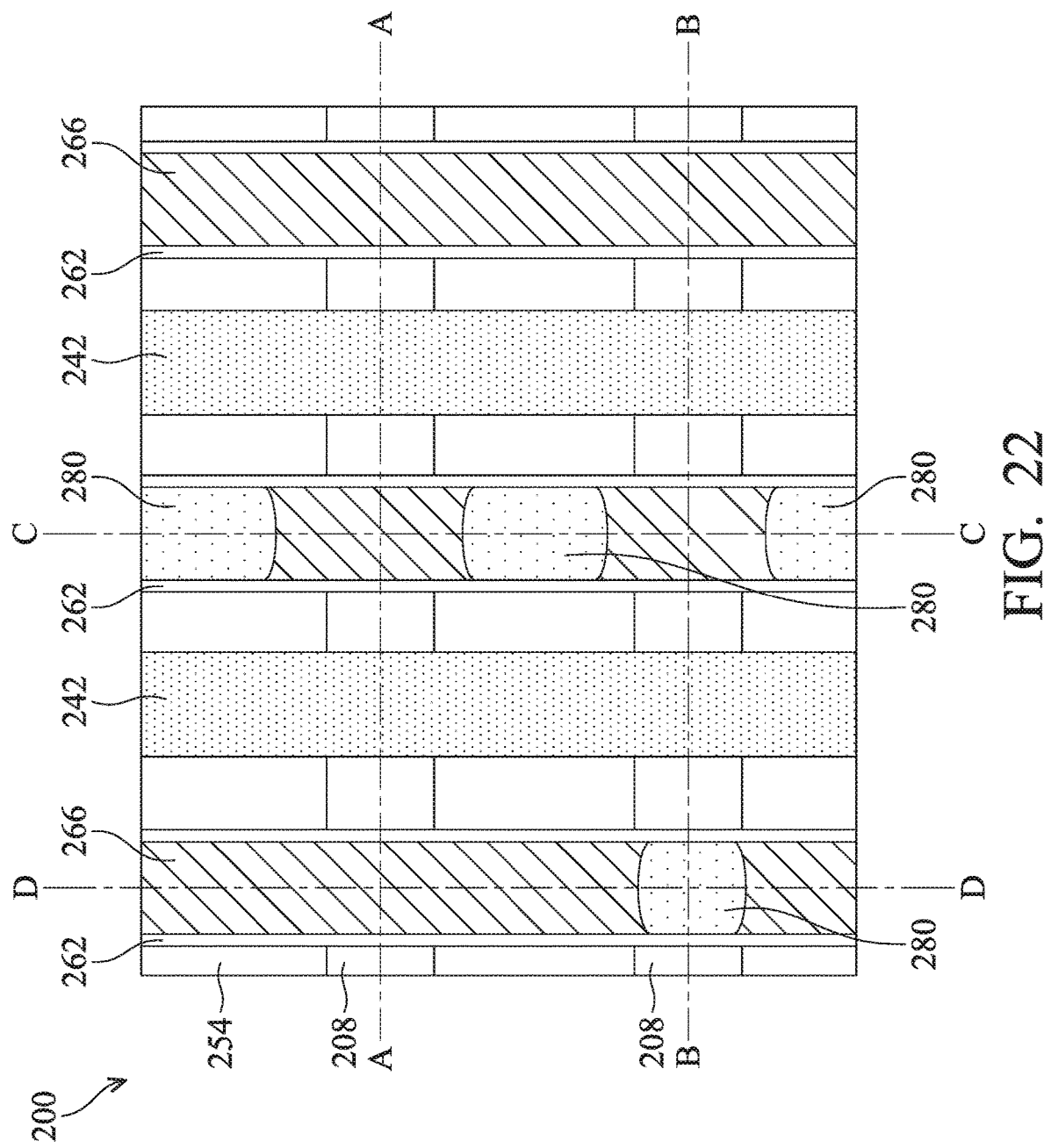
FIG. 22 illustrates a top view of a semiconductor structure during a fabrication process according to the method of FIG. 1, according to aspects of the present disclosure.

At operation 138, the method 100 (FIG. 1) fills the cut-contact openings 274 with one or more dielectric materials to form the dielectric features 280 as shown in FIG. 21. FIG. 22 also shows a top view of the structure 200 after the S/D contacts 266 are exposed from a planarization process at the conclusion of the operation 138. The planarization process, such as a CMP process, is performed to planarize the top surface of the structure 200 and remove excess one or more dielectric materials from the top surface of the structure 200. The one or more dielectric materials remaining in the cut-contact openings 274 form the dielectric features 280. The dielectric features 280 are also referred to as cut-contact features 280. Top surfaces of the S/D contacts 266 and the cut-contact features 280 are substantially coplanar. Since the sidewalls of the S/D contacts 266 contain metallic materials, at least the outer portion of the dielectric features 280 (that is in direct contact with the sidewalls of the S/D contacts 266) is free of active chemical components such as oxygen. For example, the outer portion of the dielectric features 280 may include a liner free of oxygen or oxide, such as a liner of silicon nitride. The dielectric features 280 may include some oxide in the inner portion thereof in some embodiments. Alternatively, the dielectric features 280 may include one uniform layer of silicon nitride and is free of oxide. The dielectric features 280 may be deposited using CVD, PVD, ALD, or other suitable methods. In the depicted embodiment, the dielectric features 280 have tapered sidewall profile due to the nature of anisotropic etching in forming the cut-contact openings 274. Consequently, the S/D contacts 266 has a trapezoid shape with a narrower top portion and a wider bottom portion. A width measured at the topmost portion of the dielectric feature 280 is denoted as W1, a width measured at a middle portion of the dielectric feature 280 (e.g., at a height leveled with a top surface of the S/D features 232) is denoted as W2, and a ratio of W1/W2 ranges between about 1.1 and about 3 in some embodiments. An aspect ratio of the dielectric feature 280, defined as a ratio of a height H of the dielectric feature over W2 (H/W2), ranges between about 0.5 to about 15 in some embodiments.

Figure 23:
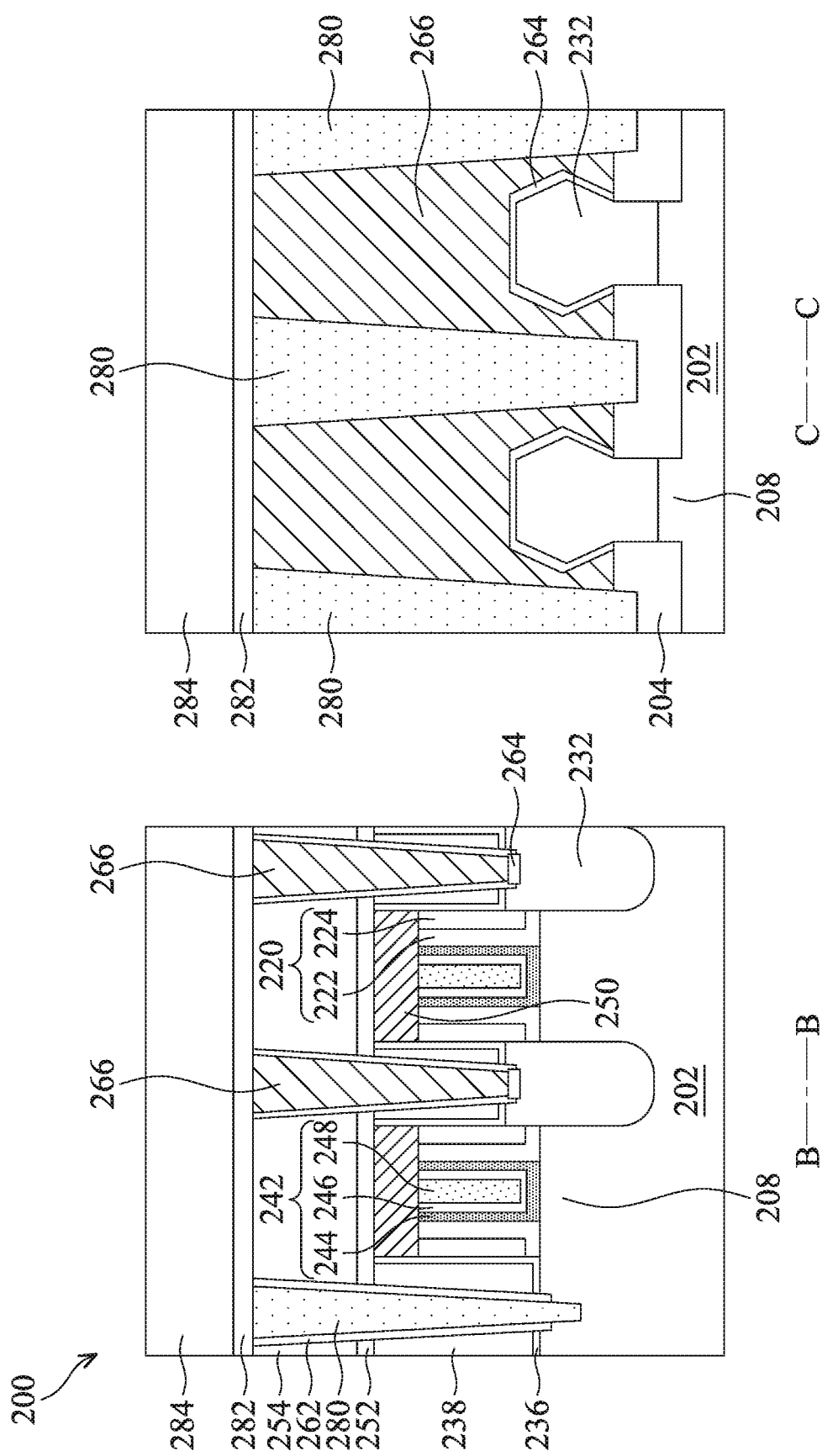

At operation 140, the method 100 (FIG. 1) forms an etch stop layer 282 and a dielectric layer 284 over the etch stop layer 282 as shown in FIG. 23. The etch stop layer 282 may be formed of silicon carbide, silicon oxynitride, silicon carbo-nitride, or the like, and may be formed using a deposition method such as CVD. The dielectric layer 284 may include a material selected from PSG, BSG, BPSG, Fluorine-doped Silicon Glass (FSG), TEOS oxide, or PECVD oxide (which may include $SiO_2$). The dielectric layer 284 may be formed using spin-on coating, FCVD, or the like, or formed using a deposition method such as PECVD or Low Pressure Chemical Vapor Deposition (LPCVD).

Figure 24:
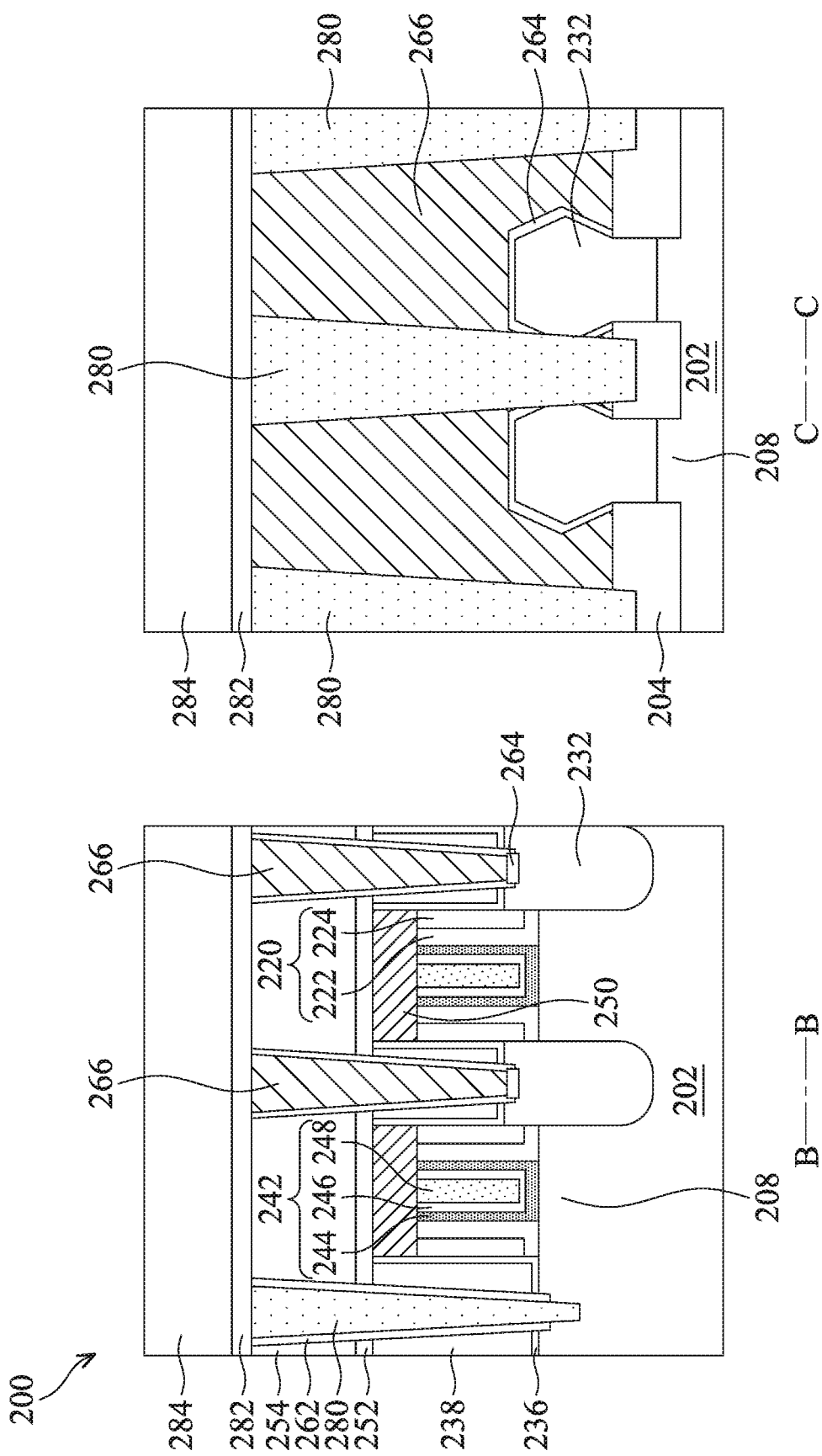

FIG. 24 illustrates an alternative embodiment of the structure 200 at the conclusion of operation 140. The various features of the structure 200 in FIG. 24 are similar to the respective counterparts in FIG. 23. One difference is that in FIG. 24 the spacing between two adjacent S/D features 232 may be smaller than a width of the cut-contact opening 274, such that a portion of the silicide feature 264 is removed and sidewalls of the S/D features 232 are exposed in the cut-contact opening 274. Consequently, the sidewalls of the S/D features 232 are in contact with the dielectric feature 280. In furtherance of some embodiments, the two adjacent S/D features 232 may even merge during the epitaxial growing process, and the cut-contact opening 274 divides the merged epitaxial feature into two separated S/D features 232 and the dielectric feature 280 is further in contact with the two separated S/D features 232. Also as illustrated in FIG. 24, a bottom portion of the S/D contacts 266 under a downward-facing facet of the S/D features 232 may be separated from the top portion of S/D contacts 266 after the cut-contact opening 274 is formed and covered by the S/D features 232 and the dielectric feature 290.

Figure 25:
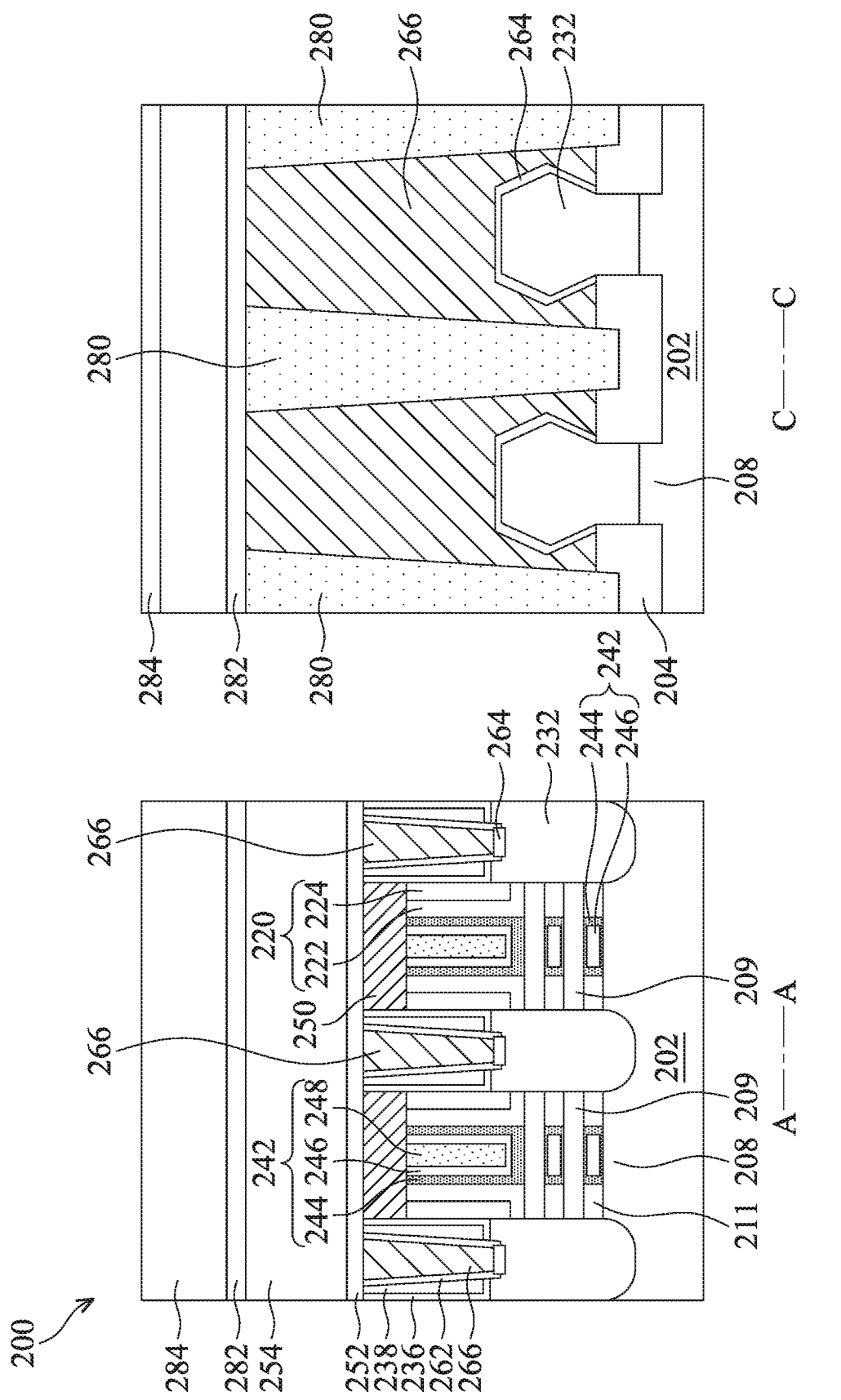

FIG. 25 illustrates yet another alternative embodiment of the structure 200 at the conclusion of operation 140. The various features of the structure 200 in FIG. 25 are similar to the respective counterparts in FIG. 23. One difference is that in FIG. 25 the transistors are GAA transistors and the channel regions in the transistors are provided by semiconductor nanostructures 209 that are vertically stacked above the substrate 202. The semiconductor nanostructures 209 are also referred to as channel layers 209. In some embodiments, the channel layers 209 are silicon (Si). The channel layers 209 may be in the forms of nanosheet channel(s), nanowire channel(s), bar-shaped channel(s), and/or other suitable channel configurations. The meal gate stack 242 (at least the gate dielectric layer 244 and the work function metal layer 246) wraps around the channel layers 209. Inner spacers 211 are interposing the metal gate stack 242 and the S/D features 232 to provide isolation therebetween. The inner spacers 211 may be a low-k dielectric material, such as $SiO_2$, SiN, SiCN, or SiOCN, and may be formed by a suitable deposition method, such as ALD.

At operation 142, the method 100 (FIG. 1) performs further processes to form a final device. For example, the method 100 may form S/D contact vias and gate contact plugs over the S/D contacts 266 and the metal gate stacks 242 respectively, form one or more dielectric layers atop the structure 200, and form metal interconnects in the dielectric layers to connect terminals of various transistors to form an IC.

Although not intended to be limiting, one or more embodiments of the present disclosure provide many benefits to a semiconductor device and a formation process thereof. For example, embodiments of the present disclosure provide methods of forming source/drain contacts without risking shorting closely spaced source/drain features. The methods further allows forming silicide features and source/drain contacts on sidewalls of source/drain features, which enlarges contacting area between source/drain features and source/drain contacts and reduces contact resistance. The methods can also be used for preventing adjacent source/drain features from merging. Furthermore, the source/drain contact formation methods can be easily integrated into existing semiconductor fabrication processes.

In one exemplary aspect, the present disclosure is directed to a method. The method includes a method. The method includes forming first and second fins disposed on a substrate, forming a gate structure over the first and second fins, epitaxially growing a first source/drain (S/D) feature on the first fin and a second S/D feature on the second fin, the first and second S/D features being on a same side of the gate structure, depositing a dielectric layer covering the first and second S/D features, etching the dielectric layer to form a trench exposing the first and second S/D features, forming a metal structure in the trench and extending from the first S/D feature to the second S/D feature, performing a cut metal process to form an opening dividing the metal structure into a first segment over the first S/D feature and a second segment over the second S/D feature, and depositing an isolation feature in the opening, the isolation feature separating the first segment from the second segment. In some embodiments, the trench exposes a top surface and sidewalls of each of the first and second S/D features. In some embodiments, the method further includes forming a silicide feature on the top surface and the sidewalls of each of the first and second S/D features. In some embodiments, the metal structure covers a top surface and sidewalls of each of the first and second S/D features. In some embodiments, the method further includes depositing an isolation structure on the substrate, each of the first and second fins extending upwardly through the isolation structure, and the trench exposing a top surface of the isolation structure. In some embodiments, the metal structure is in contact with the top surface of the isolation structure. In some embodiments, the performing of the cut metal process recesses the top surface of the isolation structure. In some embodiments, top surfaces of the first and second segments are coplanar with a top surface of the isolation feature. In some embodiments, a bottom surface of the isolation feature is below bottom surfaces of the first and second segments. In some embodiments, the depositing of the dielectric layer includes depositing a first interlayer dielectric (ILD) layer over the first and second S/D features and the gate structure, performing a planarization process to remove a portion of the ILD layer and expose the gate structure, and depositing a second ILD layer over the first ILD layer and the gate structure, the isolation feature extending through the first ILD layer and the second ILD layer.

In another exemplary aspect, the present disclosure is directed to a method. The method includes forming first and second gate structures over a substrate, growing first and second epitaxial features over the substrate, the first and second epitaxial features being between by the first and second gate structures, depositing a dielectric layer covering the first and second epitaxial features, etching the dielectric layer to form an opening between the first and second gate structures, the opening exposing the first and second epitaxial features, forming a metal feature in the opening, the metal feature being in electrical connection with the first and second epitaxial features, etching the metal feature to divide the metal feature into a first segment in electrical connection with the first epitaxial feature and a second segment in electrical connection with the second epitaxial feature, and forming a dielectric feature between the first segment and the second segment. In some embodiments, the first epitaxial feature is in contact with a first plurality of semiconductor nanostructures suspended over the substrate, the first gate structure wraps around each of the first plurality of semiconductor nanostructures, the second epitaxial feature is in contact with a second plurality of semiconductor nanostructures suspended over the substrate, and the second gate structure wraps around each of the second plurality of semiconductor nanostructures. In some embodiments, the opening exposes a top surface and sidewalls of each of the first and second epitaxial features. In some embodiments, each of the first and second segments has a top portion and a bottom portion that is wider than the top portion. In some embodiments, the etching of the metal feature exposes sidewalls of the first and second epitaxial features, and the dielectric feature is in contact with the sidewalls of the first and second epitaxial features. In some embodiments, after the growing of the first and second epitaxial features, the first and second epitaxial features are merged, and the etching of the metal feature separates the first epitaxial feature from the second epitaxial feature. In some embodiments, the dielectric feature extends below bottom surfaces of the first and second segments.

In yet another exemplary aspect, the present disclosure is directed to a semiconductor device. The semiconductor device includes a semiconductor substrate, an isolation structure over the semiconductor substrate, first and second epitaxial features over the isolation structure, a first contact structure over the first epitaxial feature and in contact with a top surface of the isolation structure, a second contact structure over the second epitaxial feature and in contact with the top surface of the isolation structure, and a dielectric layer interposing the first and second contact structures. In some embodiments, each of the first and second contact structures has a top portion and a bottom portion that is wider than the top portion. In some embodiments, the semiconductor device further includes a first silicide feature interposing the first epitaxial feature and the first contact structure and in contact with the top surface of the isolation structure, and a second silicide feature interposing the second epitaxial feature and the second contact structure and in contact with the top surface of the isolation structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming first and second fins disposed on a substrate;
forming a gate structure over the first and second fins;

epitaxially growing a first source/drain (S/D) feature on the first fin and a second S/D feature on the second fin, wherein the first and second S/D features are on a same side of the gate structure;

depositing a dielectric layer covering the first and second S/D features;

etching the dielectric layer to form a trench exposing the first and second S/D features;

forming a metal structure in the trench and extending from the first S/D feature to the second S/D feature;

performing a cut metal process to form an opening dividing the metal structure into a first segment over the first S/D feature and a second segment over the second S/D feature; and depositing an isolation feature in the opening, wherein the isolation feature separates the first segment from the second segment.

2. The method of claim 1, wherein the trench exposes a top surface and sidewalls of each of the first and second S/D features.

3. The method of claim 2, further comprising:

forming a silicide feature on the top surface and the sidewalls of each of the first and second S/D features.

4. The method of claim 1, wherein the metal structure covers a top surface and sidewalls of each of the first and second S/D features.

5. The method of claim 1, further comprising:

depositing an isolation structure on the substrate, wherein each of the first and second fins extends upwardly through the isolation structure, and wherein the trench exposes a top surface of the isolation structure.

6. The method of claim 5, wherein the metal structure is in contact with the top surface of the isolation structure.

7. The method of claim 5, wherein the performing of the cut metal process recesses the top surface of the isolation structure.

8. The method of claim 1, wherein top surfaces of the first and second segments are coplanar with a top surface of the isolation feature.

9. The method of claim 1, wherein a bottom surface of the isolation feature is below bottom surfaces of the first and second segments.

10. The method of claim 1, wherein the depositing of the dielectric layer includes:

depositing a first interlayer dielectric (ILD) layer over the first and second S/D features and the gate structure;

performing a planarization process to remove a portion of the ILD layer and expose the gate structure; and depositing a second ILD layer over the first ILD layer and the gate structure, wherein the isolation feature extends through the first ILD layer and the second ILD layer.

11. A method, comprising:

forming first and second gate structures over a substrate;

growing first and second epitaxial features over the substrate, wherein the first and second epitaxial features are between by the first and second gate structures;

depositing a dielectric layer covering the first and second epitaxial features;

etching the dielectric layer to form an opening between the first and second gate structures, wherein the opening exposes the first and second epitaxial features;

forming a metal feature in the opening, wherein the metal feature is in electrical connection with the first and second epitaxial features;

etching the metal feature to divide the metal feature into a first segment in electrical connection with the first epitaxial feature and a second segment in electrical connection with the second epitaxial feature; and forming a dielectric feature between the first segment and the second segment.

12. The method of claim 11, wherein the first epitaxial feature is in contact with a first plurality of semiconductor nanostructures suspended over the substrate, the first gate structure wraps around each of the first plurality of semiconductor nanostructures, the second epitaxial feature is in contact with a second plurality of semiconductor nanostructures suspended over the substrate, and the second gate structure wraps around each of the second plurality of semiconductor nanostructures.

13. The method of claim 11, wherein the opening exposes a top surface and sidewalls of each of the first and second epitaxial features.

14. The method of claim 11, wherein each of the first and second segments has a top portion and a bottom portion that is wider than the top portion.

15. The method of claim 11, wherein the etching of the metal feature exposes sidewalls of the first and second epitaxial features, and the dielectric feature is in contact with the sidewalls of the first and second epitaxial features.

16. The method of claim 11, wherein after the growing of the first and second epitaxial features, the first and second epitaxial features are merged, and wherein the etching of the metal feature separates the first epitaxial feature from the second epitaxial feature.

17. The method of claim 11, wherein the dielectric feature extends below bottom surfaces of the first and second segments.

* * * * *